(12) United States Patent
Park et al.

(10) Patent No.: US 9,735,349 B2
(45) Date of Patent: Aug. 15, 2017

(54) MAGNETORESISTIVE RANDOM ACCESS MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Jong-Chul Park, Seongnam-si (KR); Byoung-Jae Bae, Hwaseong-si (KR); Shin-Jae Kang, Seoul (KR); Young-Seok Choi, Yongin-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/612,323

(22) Filed: Feb. 3, 2015

(65) Prior Publication Data
US 2015/0287912 A1 Oct. 8, 2015

(30) Foreign Application Priority Data
Apr. 4, 2014 (KR) .......................... 10-2014-0040267

(51) Int. Cl.
| H01L 43/08 | (2006.01) |
|---|---|
| H01L 43/12 | (2006.01) |
| H01L 27/22 | (2006.01) |

(52) U.S. Cl.
CPC ............ *H01L 43/12* (2013.01); *H01L 27/228* (2013.01); *H01L 43/08* (2013.01)

(58) Field of Classification Search
CPC ........ H01L 43/08; H01L 43/12; H01L 27/228
See application file for complete search history.

(56) References Cited

U.S. PATENT DOCUMENTS

| 6,780,652 B2 | 8/2004 | Lee | |
|---|---|---|---|
| 6,984,530 B2 | 1/2006 | Lee et al. | |
| 7,422,912 B2 | 9/2008 | Anthony et al. | |
| 7,531,367 B2 | 5/2009 | Assefa et al. | |
| 8,119,425 B2 | 2/2012 | Cho et al. | |
| 2008/0160725 A1* | 7/2008 | Byun | H01L 21/67132 438/464 |
| 2010/0019297 A1* | 1/2010 | Hwang | H01L 43/08 257/295 |
| 2012/0135543 A1 | 5/2012 | Shin et al. | |
| 2013/0044537 A1* | 2/2013 | Ishigaki | G11C 11/16 365/158 |
| 2013/0267042 A1 | 10/2013 | Satoh et al. | |
| 2014/0116985 A1* | 5/2014 | Satake | H01L 43/12 216/22 |
| 2014/0175583 A1* | 6/2014 | Doyle | H01L 43/08 257/427 |

FOREIGN PATENT DOCUMENTS

| KR | 10-2003-0078136 A | 10/2003 |
|---|---|---|
| KR | 10-2010-0018814 A | 2/2010 |
| KR | 10-2010-0076557 A | 7/2010 |

\* cited by examiner

*Primary Examiner* — John C Ingham
*Assistant Examiner* — Ismail Muse
(74) *Attorney, Agent, or Firm* — Lee & Morse, P.C.

(57) ABSTRACT

In a method of manufacturing an MRAM device, a lower electrode and a preliminary first free layer pattern sequentially stacked are formed on a substrate. An upper portion of the preliminary first free layer pattern is removed to form a first free layer pattern. A second free layer and a tunnel barrier layer are sequentially formed on the first free layer pattern. The second free layer is partially oxidized to form a second free layer pattern. A fixed layer structure is formed on the tunnel barrier layer.

17 Claims, 22 Drawing Sheets

MAGNETORESISTIVE RANDOM ACCESS MEMORY DEVICE AND METHOD OF MANUFACTURING THE SAME

CROSS-REFERENCE TO RELATED APPLICATION

Korean Patent Application No. 10-2014-0040267, filed on Apr. 4, 2014 in the Korean Intellectual Property Office, and entitled: "Magnetoresistive Random Access Memory Device and Method of Manufacturing the Same," is incorporated by reference herein in its entirety.

BACKGROUND

1. Field

Example embodiments relate to a semiconductor device and a method of manufacturing the same. More particularly, example embodiments relate to a magnetoresistive random access memory (MRAM) device and a method of manufacturing the same.

2. Description of the Related Art

An MRAM device is a non-volatile memory device, and may include a magnetic tunnel junction (MTJ) structure. The MTJ structure may include a fixed layer pattern structure, a tunnel barrier layer pattern, and a free layer pattern sequentially stacked on a substrate, and the fixed layer pattern structure, tunnel barrier layer pattern, and free layer pattern may be formed by a physical etching process such as an ion sputtering process.

SUMMARY

Embodiments may be realized by providing a method of manufacturing an MRAM device, the method including forming a lower electrode and a preliminary first free layer pattern sequentially stacked on a substrate, removing an upper portion of the preliminary first free layer pattern to form a first free layer pattern, sequentially forming a second free layer and a tunnel barrier layer on the first free layer pattern, partially oxidizing the second free layer to form a second free layer pattern, and forming a fixed layer structure on the tunnel barrier layer.

Forming the lower electrode and the preliminary first free layer pattern may include sequentially forming a lower electrode layer, a first free layer, and a sacrificial layer on the substrate, and partially oxidizing the lower electrode layer and the first free layer.

Partially oxidizing the lower electrode layer and the first free layer may include forming a mask on the sacrificial layer, the mask partially exposing a top surface of the sacrificial layer, and performing an ion implantation process using the mask as an ion implantation mask to partially implant oxygen ions into the sacrificial layer, the first free layer, and the lower electrode layer.

Forming the second free layer pattern may include diffusing the oxygen ions implanted into the first free layer into the second free layer.

Forming the lower electrode and the preliminary first free layer pattern may include sequentially forming a lower electrode layer, a first free layer, a sacrificial layer, and a hard mask on the substrate, anisotropically etching the sacrificial layer using the hard mask as an etching mask to form a sacrificial layer pattern, and sequentially patterning the first free layer and the lower electrode layer using the hard mask and the sacrificial layer pattern as an etching mask.

Forming the preliminary first free layer pattern may include forming a plurality of preliminary first free layer patterns, and after forming the lower electrode and the preliminary first free layer pattern, the method may further include forming a capping layer on the substrate to cover the lower electrode, the preliminary first free layer pattern, the sacrificial layer pattern, and the hard mask, forming an oxide layer on the capping layer to sufficiently cover the lower electrode, the preliminary first free layer pattern, the sacrificial layer pattern, and the hard mask, and planarizing the oxide layer and the capping layer until a top surface of the sacrificial layer pattern is exposed to form an oxide layer pattern and a capping layer pattern, respectively, the oxide layer pattern and the capping layer pattern being formed between neighboring two preliminary first free layer patterns, and the capping layer pattern surrounding the oxide layer pattern.

Forming the second free layer pattern may include diffusing oxygen ions included in the oxide layer pattern into the second free layer.

Forming the first free layer pattern may include performing an ion sputtering process to remove the sacrificial layer pattern and an upper portion of the preliminary first free layer pattern.

Forming the first free layer pattern may include performing a wet etching process using deionized water to remove the sacrificial layer pattern, and performing an ion sputtering process to remove the upper portion of the preliminary first free layer pattern.

The second free layer may be formed to have a thickness smaller than that of the first free layer pattern.

The second free layer pattern may be formed to include a material substantially the same as that of the first free layer pattern.

The method may include, after forming the fixed layer structure, forming a wiring on the fixed layer structure.

Embodiments may be realized by providing an MRAM device, including a lower electrode on a substrate, a magnetic tunnel junction (MTJ) structure, including, first and second free layer patterns sequentially stacked on the lower electrode, a tunnel barrier layer on the second free layer pattern, a fixed layer structure on the tunnel barrier layer, and a wiring on the MTJ structure.

The device may include a metal oxide layer pattern surrounding a sidewall of the second free layer pattern.

The wiring may directly contact a top surface of the MTJ structure.

Embodiments may be realized by providing a method of manufacturing an MRAM device, the method including forming a first free layer pattern on a lower electrode by a physical etching process, the lower electrode being on a substrate, forming a second free layer on the first free layer pattern, and forming a second free layer pattern by partially oxidizing the second free layer.

Partially oxidizing the second free layer may include diffusing oxygen ions into the second free layer to oxidize a portion of the second free layer and form an insulative first metal oxide layer pattern, and portions of the second free layer into which oxygen ions are not diffused form the second free layer pattern.

Diffusing oxygen ions into the second free layer may include performing a heat treatment process, and the first and second free layer patterns each includes at least one of cobalt, iron, and nickel.

The physical etching process may include a reactive plasma etching process or an ion sputtering process.

The physical etching process may include a reactive plasma etching process performed using an etching gas including at least one of hydrogen fluoride and ammonia (NH$_3$) and a reaction gas including oxygen.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
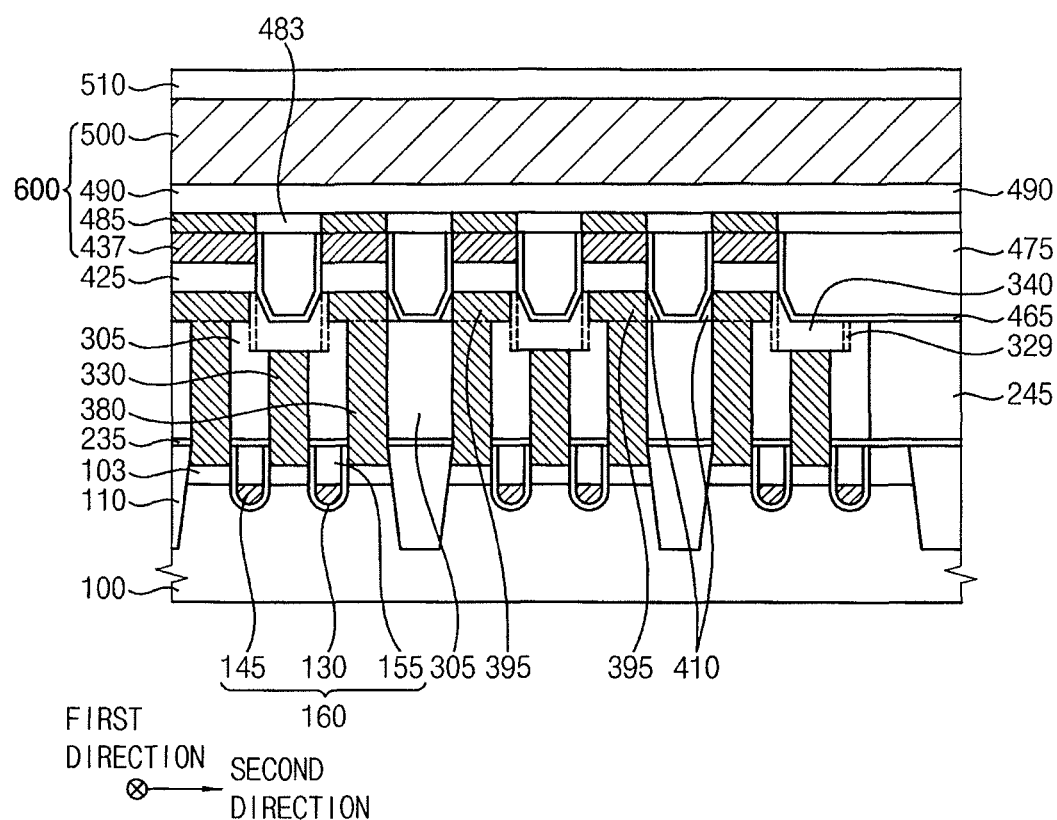
FIG. 1 illustrates a cross-sectional view of an MRAM device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numerals refer to like elements throughout. As used herein, the term "and/or" includes any and all combinations of one or more of the associated listed items.

It will be understood that, although the terms first, second, third, fourth, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device.

The plurality of device structures may be arranged in an array and/or in a two-dimensional pattern.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view of an MRAM device in accordance with example embodiments.

Referring to FIG. 1, the MRAM device may include a transistor, a lower electrode 425, a first magnetic tunnel junction (MTJ) structure 600, and a wiring 510. The MRAM device may further include a source line 330, a contact plug 380, and a pad 395.

The transistor may include a gate structure 160 buried at an upper portion of a substrate 100 and an impurity region 103 at an upper portion of the substrate 100 adjacent to the gate structure 160. The gate structure 160 may include a gate electrode 145 and a first capping layer pattern 155 sequentially stacked in the substrate 100, and further include a gate insulation layer 130 in the substrate 100, which may cover a sidewall and a bottom of the gate electrode 145 and a sidewall of the first capping layer pattern 155. In example embodiments, the gate structure 160 may extend in a first direction substantially parallel to a top surface of the substrate 100, and a plurality of gate structures 160 may be formed in a second direction substantially perpendicular to the first direction and substantially parallel to the top surface of the substrate 100.

The gate electrode 145 may include, a metal, e.g., tungsten, titanium, or tantalum, a metal nitride, e.g., tungsten nitride, titanium nitride, or tantalum nitride, and/or a metal silicide. The first capping layer pattern 155 may include, a nitride, e.g., silicon nitride. The gate insulation layer 130 may include an oxide, e.g., silicon oxide.

The impurity region 103 may include n-type impurities, e.g., phosphorus or arsenic, or p-type impurities, e.g., boron or gallium, and may serve as a source/drain region of the transistor.

The substrate 100 may include an isolation layer pattern 110 thereon, and a region of the substrate 100 on which the isolation layer pattern 110 is formed may be referred to as a field region, and a region of the substrate 100 on which no isolation layer pattern is formed may be referred to as an active region. In example embodiments, two gate structures 160 may be formed in each active region. The substrate 100 may be, e.g., a silicon substrate, a germanium substrate, a silicon-germanium substrate, a silicon-on-insulator (SOI) substrate, or a germanium-on-insulator (GOI) substrate. The isolation layer pattern 110 may include an oxide, e.g., silicon oxide.

A first etch stop layer pattern 235 and a first pattern 305 may be sequentially formed on the substrate 100 to overlap the gate structure 160 and the isolation layer pattern 110, and a top surface of the impurity region 103 may be exposed. The first etch stop layer pattern 235 and the first pattern 305 may include substantially the same material, e.g., a nitride such as silicon nitride.

The source line 330 may be formed on a portion of the substrate 100 between neighboring gate structures 160 in each active region to contact a top surface of the impurity region 103. The contact plug 380 may be formed on a portion of the substrate 100 between the gate structure 160 and the isolation layer pattern 110 to contact a top surface of the impurity region 103. The source line 330 and the contact plug 380 may be alternately and repeatedly formed in the second direction to contact the impurity region 103, and the source line 330 and the contact plug 380 may be electrically connected to the transistor. A sidewall of each of the source line 330 and the contact plug 380 may be surrounded by the first etch stop layer pattern 235 and the first pattern 305 sequentially stacked. The contact plug 380 may have a top surface substantially coplanar with a top surface of the first pattern 305, and the source line 330 may have a top surface lower than the top surface of the first pattern 305.

The source line 330 may include a metal, e.g., tungsten, titanium, or tantalum, or a metal nitride, e.g., tungsten nitride, titanium nitride, or tantalum nitride. The contact plug 380 may include a metal, e.g., tungsten, titanium, or tantalum, and/or doped polysilicon.

The pad 395 may be formed on the contact plug 380 and a portion of the first pattern 305 to contact the top surfaces thereof. The pad 395 may include a metal, e.g., tungsten, titanium, or tantalum, and/or doped polysilicon, and may include a material substantially the same as that of the contact plug 380. In example embodiments, a plurality of pads 395 may be formed both in the first and second directions.

A fourth capping layer pattern 340 may be formed between neighboring pads 395 in each active region to contact the top surface of the source line 330, and a division layer pattern 410 may be formed between neighboring pads 395 in different active regions to contact the top surface of the first pattern 305. The fourth capping layer pattern 340 and the division layer pattern 410 may be formed between the pads 295 alternately and repeatedly in the second direction. A sidewall of the fourth capping layer pattern 340 may be surrounded by a second etch stop layer pattern 329 on the first pattern 305. The fourth capping layer pattern 340, the division layer pattern 410, and the second etch stop layer pattern 329 may include a nitride, e.g., silicon nitride.

The lower electrode 425 may be formed on the pad 295 to contact a top surface thereof. The lower electrode 425 may include a conductive material, e.g., a metal such as, for example, tungsten, titanium, or tantalum, and/or a metal nitride such as, for example, tungsten nitride, titanium nitride, or tantalum nitride. In example embodiments, a plurality of lower electrodes 425 may be formed both in the first and second directions.

The first MTJ structure 600 may include first and second free layer patterns 437 and 485, a tunnel barrier layer 490, and a fixed layer structure 500 sequentially stacked on the lower electrode 425.

The first free layer pattern 437 may contact the lower electrode 425 and have a first thickness, and the second free layer pattern 385 may have a second thickness smaller than the first thickness. The first and second free layer patterns 437 and 485 may include a ferromagnetic material, e.g., cobalt, iron, or nickel, may include substantially the same material, and may have substantially the same magnetization direction. In example embodiments, the first and second free layer patterns 437 and 485 may have a magnetization direction substantially vertical to a top surface of the substrate 100 or a magnetization direction substantially parallel to the top surface of the substrate 100. The first and second thicknesses may be changed according to the first MTJ structure 600. In example embodiments, a plurality of first free layer patterns 437 and a plurality of second free layer patterns 485 may be formed both in the first and second directions.

An oxide layer pattern 475 and a fifth capping layer pattern 465 covering a sidewall and a bottom of the oxide layer pattern 475 may be formed on the fourth capping layer pattern 340, the second etch stop layer pattern 329, the division layer pattern 410, the first pattern 305, and a first insulating interlayer pattern 245 to cover sidewalls of the lower electrode 425 and the first free layer pattern 437, and a first metal oxide layer pattern 483 may be formed on the oxide layer pattern 475 and the fifth capping layer pattern 465 to contact top surfaces thereof and cover a sidewall of the second free layer pattern 485.

The fifth capping layer pattern 465 may include a metal oxide, e.g., aluminum oxide. The oxide layer pattern 475 may include, e.g., silicon oxide. The first metal oxide layer pattern 483 may include oxygen and a material substantially the same as that of the second free layer pattern 485, e.g., a ferromagnetic material such as, for example, cobalt, iron, or nickel.

The tunnel barrier layer 490 may be formed on the second free layer pattern 485 and the first metal oxide layer pattern 483. The tunnel barrier layer 490 may include a metal oxide, a metal nitride or a metal oxynitride, e.g., magnesium oxide or aluminum oxide.

The fixed layer structure 500 may be formed on the tunnel barrier layer 490 and include a first pinning layer, an anti-ferromagnetic coupling spacer layer, and a second pinning layer sequentially stacked. The first and second pinning layers may include a ferromagnetic material, e.g., cobalt, palladium, and the anti-ferromagnetic coupling spacer layer may include, e.g., ruthenium, iridium, or rhodium. The first and second pinning layers may have first and second magnetization directions, respectively, which may be fixed and opposite to each other. In example embodiments, the first and second magnetization directions may be vertical or horizontal.

The wiring 510 may be formed on the fixed layer structure 500 to contact a top surface thereof. The wiring 510 may include a metal, e.g., copper. In example embodiments, the wiring 510 may extend in the second direction, and a plurality of wirings 510 may be formed in the first direction.

FIGS. 2 to 27 illustrate cross-sectional views of stages of a method of manufacturing an MRAM device in accordance with example embodiments.

Figure 2:
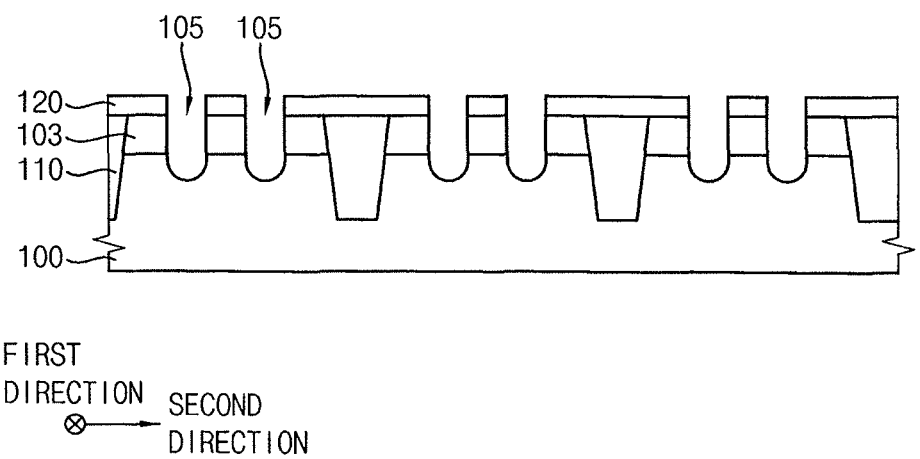
FIGS. 2 to 27 illustrate cross-sectional views of stages of a method of manufacturing an MRAM device in accordance with example embodiments.

Referring to FIG. 2, after implanting impurities onto an upper portion of a substrate 100, an impurity region 103 may be formed, and an isolation layer pattern 110 may be formed on the substrate 100. A region of the substrate 100 on which the isolation layer pattern 110 is formed may be referred to as a field region, and a region of the substrate 100 on which no isolation layer pattern is formed may be referred to as an active region.

The substrate 100 may be, e.g., a silicon substrate, a germanium substrate, a silicon-germanium substrate, a silicon-on-insulator (SOI) substrate, or a germanium-on-insulator (GOI) substrate.

The impurity region 103 may be formed by performing an implantation process on the substrate 100, and may be formed to include n-type impurities, e.g., phosphorus or arsenic, or p-type impurities, e.g., boron or gallium. The impurity region 103 together with a gate structure 160 subsequently formed may define a transistor, and may serve as a source/drain region of the transistor.

The isolation layer pattern 110 may be formed by forming a first trench (not shown) at an upper portion of the substrate 100, forming an isolation layer to sufficiently fill the first trench, and planarizing the isolation layer until a top surface of the substrate 100 is exposed. The isolation layer may be formed to include, an oxide, e.g., silicon oxide.

In some embodiments, the impurity region 103 may be formed not before forming the isolation layer pattern 110 but after forming the isolation layer pattern 110.

A first mask 120 partially exposing the top surface of the substrate 100 may be formed on the substrate 100, an upper portion of the substrate 100 may be removed using the first mask 120 as an etching mask, and a second trench 105 may be formed.

The second trench 105 may extend in a first direction substantially parallel to the top surface of the substrate 100, and a plurality of second trenches 105 may be formed in a second direction substantially perpendicular to the first direction and substantially parallel to the top surface of the substrate 100. In example embodiments, two second trenches 105 may be formed in each of the active regions that may be divided by the isolation layer pattern 110.

Figure 3:
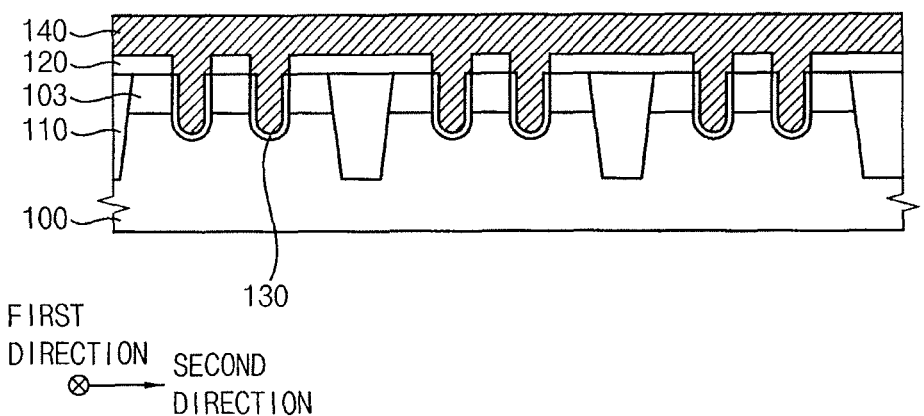

Referring to FIG. 3, a gate insulation layer 130 may be formed on an inner wall of the second trench 105, and a gate electrode layer may be formed on the gate insulation layer 130 and the first mask 120 to sufficiently fill the second trench 105.

In example embodiments, the gate insulation layer 130 may be formed by a thermal oxidation process on the exposed upper portion of the substrate 100 by the second trench 105 or a chemical vapor deposition (CVD) process, and the gate insulation layer 130 may be formed to include an oxide, e.g., silicon oxide.

The gate electrode layer 140 may be formed to include a metal, e.g., tungsten, titanium, or tantalum, a metal nitride, e.g., tungsten nitride, titanium nitride, or tantalum nitride, and/or a metal silicide.

Figure 4:
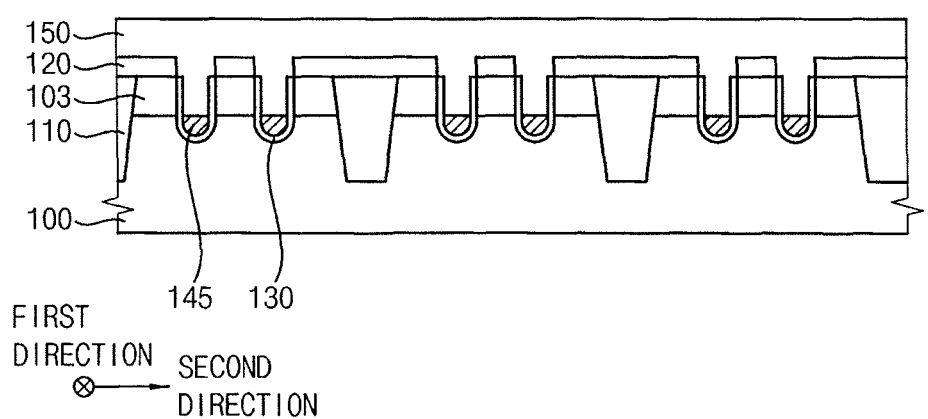

Referring to FIG. 4, an upper portion of the gate electrode layer 140 may be removed, a gate electrode 145 partially filling the second trench 105 may be formed, a first capping layer 150 may be formed on the gate electrode 145, the gate insulation layer 130, and the first mask 120, and a remaining portion of the second trench 105 may be filled.

In example embodiments, the gate electrode layer 140 may be removed by a chemical mechanical polishing (CMP) process and/or an etch back process, the gate electrode 145 may be formed in a lower portion of the second trench 105 to extend in the first direction, and a plurality of gate electrodes 145 may be formed in the second direction. When the gate electrode 145 is formed, a portion of the gate insulation layer 130 may be removed. In this case, the gate insulation layer 130 may be formed on a lower inner wall of the second trench 105 to surround a sidewall and a bottom of the gate electrode 145.

The first capping layer 150 may be formed to include a nitride, e.g., silicon nitride.

Figure 5:
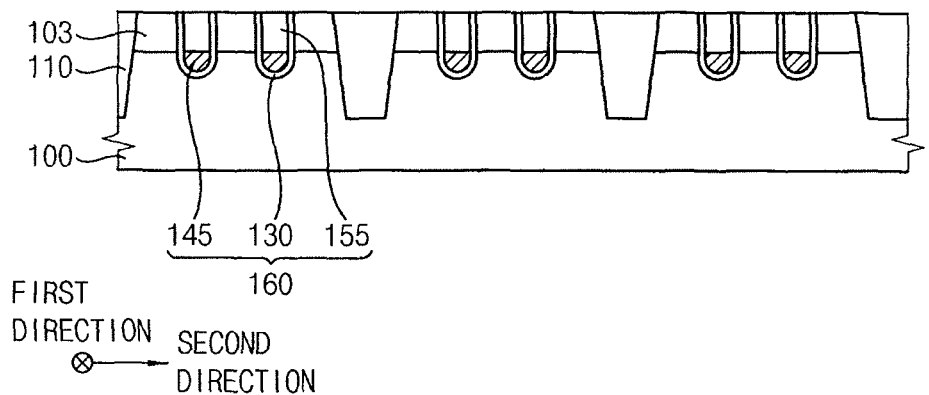

Referring to FIG. 5, an upper portion of the first capping layer 150 and the first mask 120 may be removed by, e.g., a CMP process until the top surface of the substrate 100 is exposed, a first capping layer pattern 155 may be formed, and an upper portion of the second trench 105 may be filled. In example embodiments, a plurality of first capping layer patterns 155 may be formed in the second direction, each of which may extend in the first direction.

The gate insulation layer 130, the gate electrode 145, and the first capping layer pattern 155 may form the gate structure 160. The gate structure 160 may be a buried gate structure filling the second trench 105. In example embodiments, a plurality of gate structures 160 may be formed in the second direction, each of which may extend in the first direction. In example embodiments, two gate structures 160 may be formed within each active region.

Figure 6:
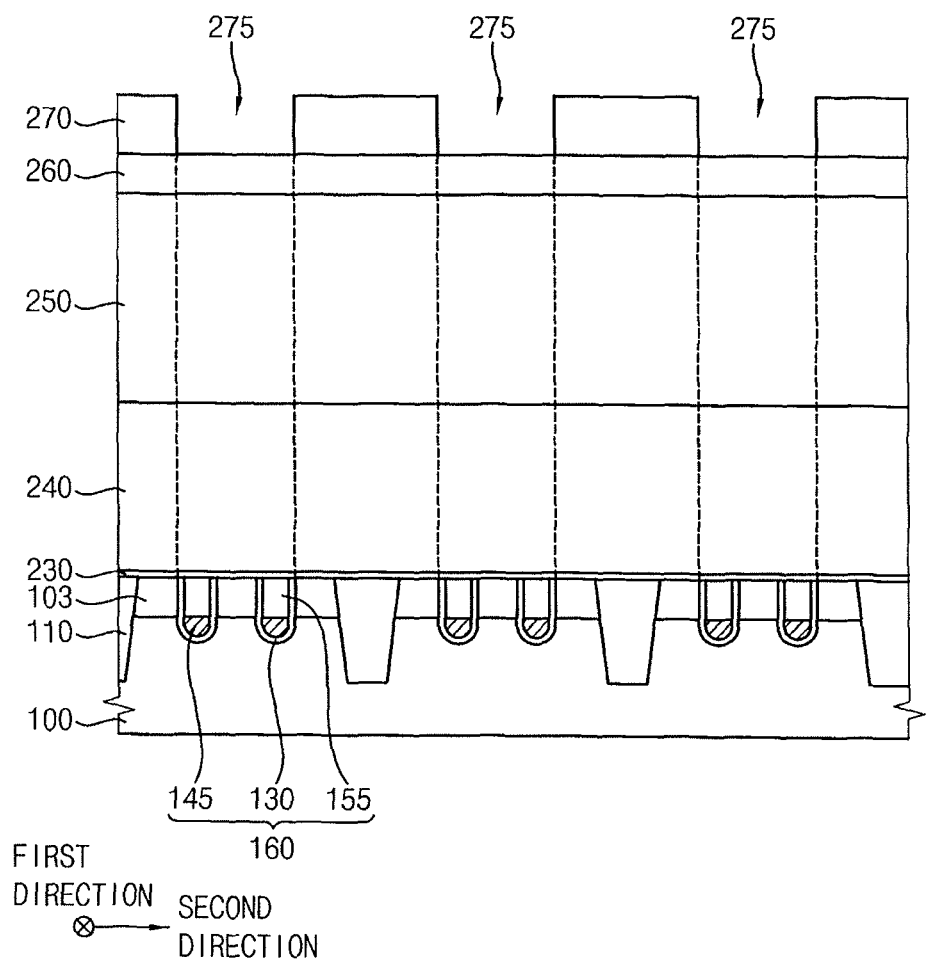

Referring to FIG. 6, a first etch stop layer 230, a first insulating interlayer 240, a silicon-on-hardmask (SOH) layer 250, a silicon oxynitride layer 260, and a first photoresist pattern 270 may be sequentially formed on the substrate 100 having the isolation layer pattern 110 thereon.

The first etch stop layer 230 may be formed to include a nitride, e.g., silicon nitride, and the first insulating interlayer 240 may be formed to include an oxide, e.g., boro phospho silicate glass (BPSG), undoped silicate glass (USG), or spin on glass (SOG). A portion of the first insulating interlayer 240 may be removed in subsequent processes, and the first may serve as a sacrificial layer.

The first photoresist pattern 270 may include a first opening 275 exposing a portion of a top surface of the silicon oxynitride layer 260. In example embodiments, the first opening 275 may extend in the first direction, and a plurality of first openings 275 may be formed in the second direction. In example embodiments, each first opening 275 may overlap two of the gate structures 160 adjacent to each other in each active region and a portion of the substrate 100 therebetween.

Figure 7:
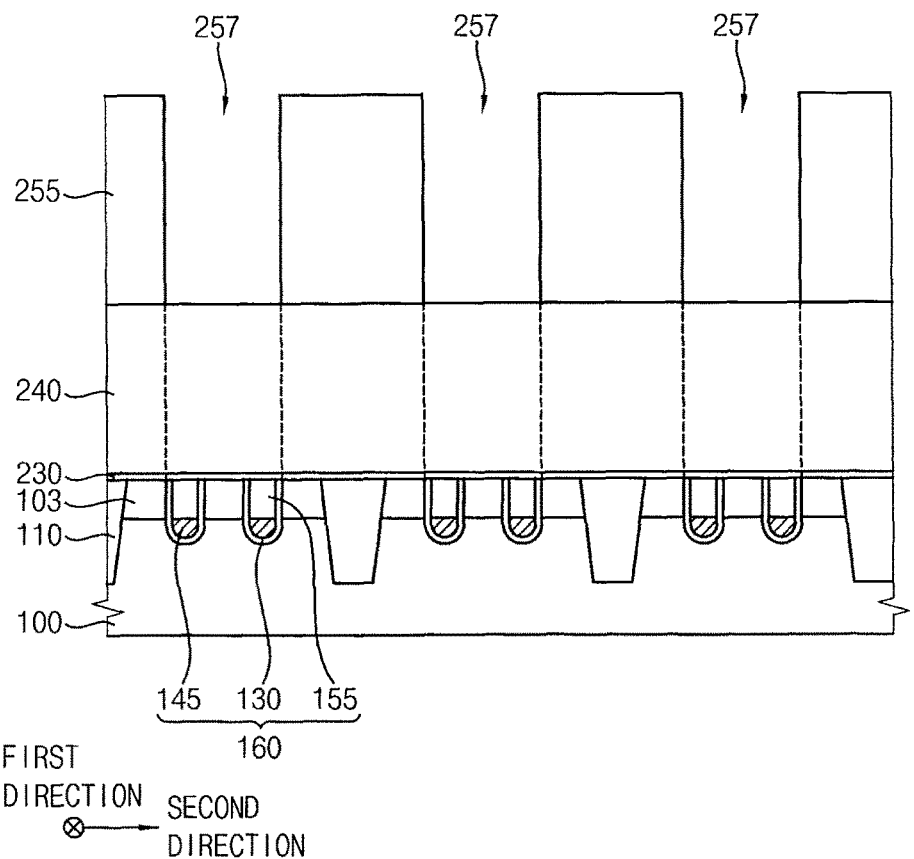

Referring to FIG. 7, the silicon oxynitride layer 260 and the SOH layer 250 may be sequentially etched using the first photoresist pattern 270 as an etching mask, a silicon oxynitride layer pattern and a SOH layer pattern 255 may be formed, and the SOH layer pattern 255 may include second openings 257 exposing portions of a top surface of the first insulating interlayer 240. The silicon oxynitride layer pattern may be removed by, e.g., a wet etching process after the SOH layer pattern 255 is formed.

Figure 8:
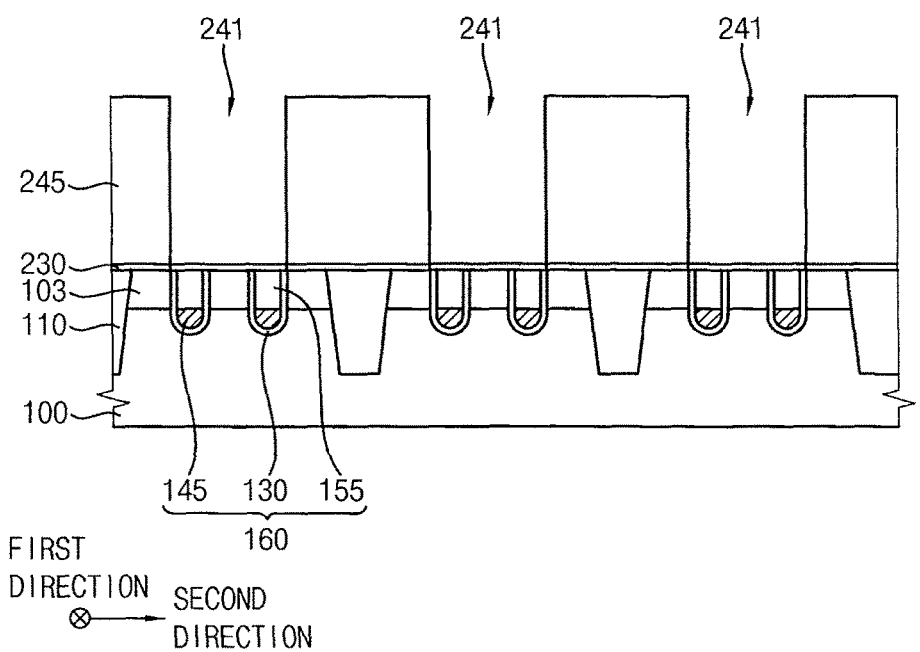

Referring to FIG. 8, the first insulating interlayer 240 may be etched using the SOH layer pattern 255 as an etching mask, the exposed portions of the first insulating interlayer 240 may be removed, a first insulating interlayer pattern 245 having third openings 241 may be formed, and portions of a top surface of the first etch stop layer 230 may be exposed.

Figure 9:
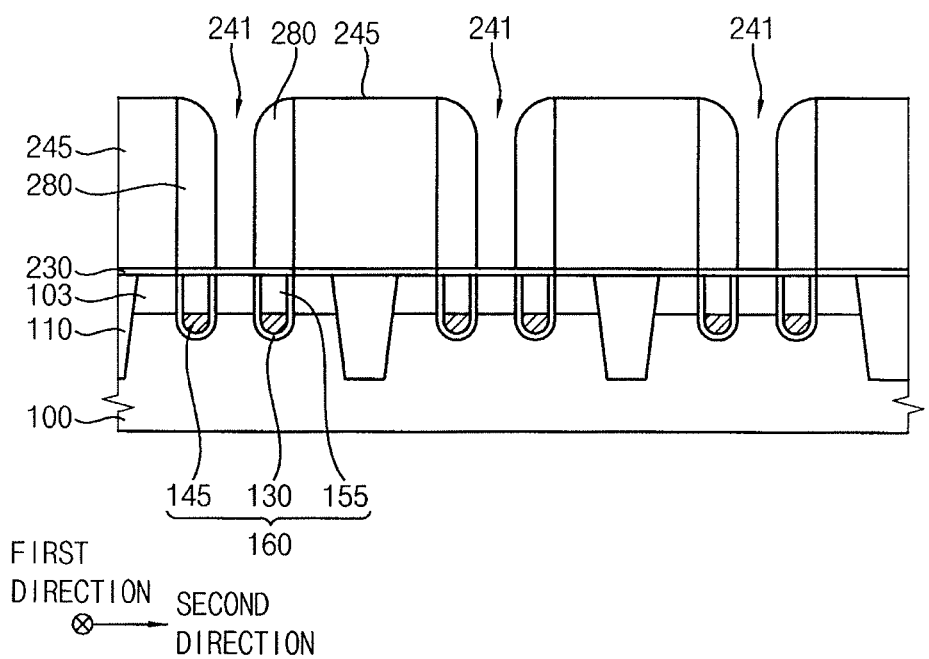

Referring to FIG. 9, a first spacer 280 may be formed on a sidewall of each third opening 241.

The first spacer 280 may be formed by forming a first spacer layer on the sidewalls of the third openings 241, the exposed portions of the first etch stop layer 230, and a top surface of the first insulating interlayer pattern 245, and anisotropically etching the first spacer layer. Two first spacers 280 may be formed on each active region, and each first spacer 280 may be formed to overlap the gate structure 160. Each third opening 241 may extend in the first direction, and a plurality of third openings 241 may be formed in the second direction. Each first spacer 280 may extend in the first direction, and a plurality of first spacers 280 may be formed in the second direction. The first spacer layer may be formed to include a nitride, e.g., silicon nitride.

Figure 10:
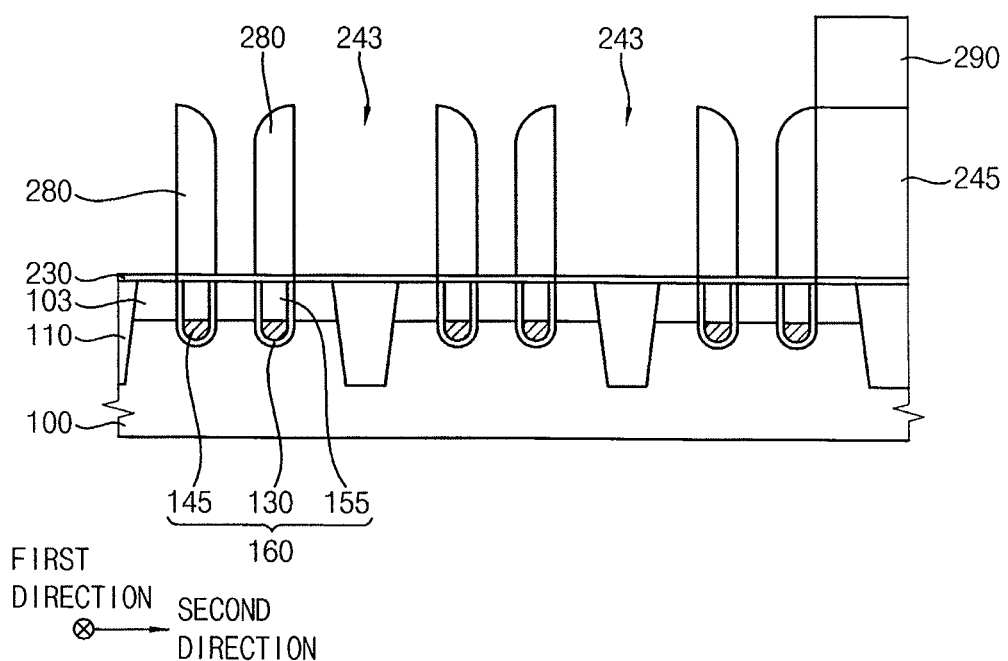

Referring to FIG. 10, a second mask 290 may be formed on a portion of the first insulating interlayer pattern 245, exposed portions of the first insulating interlayer pattern 245 not covered by the second mask 290 may be removed, and fourth openings 243 exposing portions of a top surface of the first etch stop layer 230 may be formed.

The exposed portions of the first insulating interlayer pattern 245 may be removed by, e.g., a wet etching process.

The first spacers 280 may remain on the substrate 100, and may be spaced apart from each other in the second direction.

Figure 11:
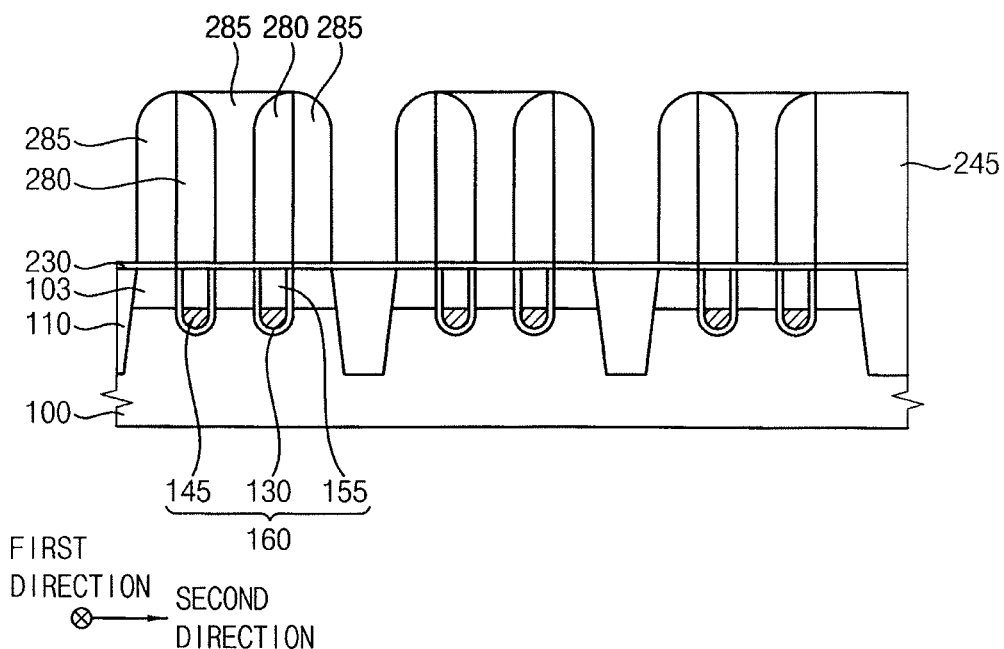

Referring to FIG. 11, the second mask 290 may be removed, and second spacers 285 contacting the first spacers 280 may be formed on the substrate 100.

In example embodiments, the second spacers 285 may be formed by forming a second spacer layer on the first etch stop layer 230 and the first insulating interlayer pattern 245 to cover the first spacers 280, and anisotropically etching the second spacer layer. The second spacer layer may be formed to include an oxide, e.g., silicon oxide, and a portion of the second spacer layer contacting the first insulating interlayer pattern 245 may be merged thereto.

In example embodiments, the second spacers 285 may sufficiently fill spaces between two of the first spacers 280 that are spaced apart from each other in the second direction on each active region, and may partially fill spaces between two of the first spacers 280 adjacent to each other defining the fourth opening 243. Portions of the exposed top surface of the first etch stop layer 230 by the fourth openings 243 may not be completely covered by the second spacers 285.

Figure 12:
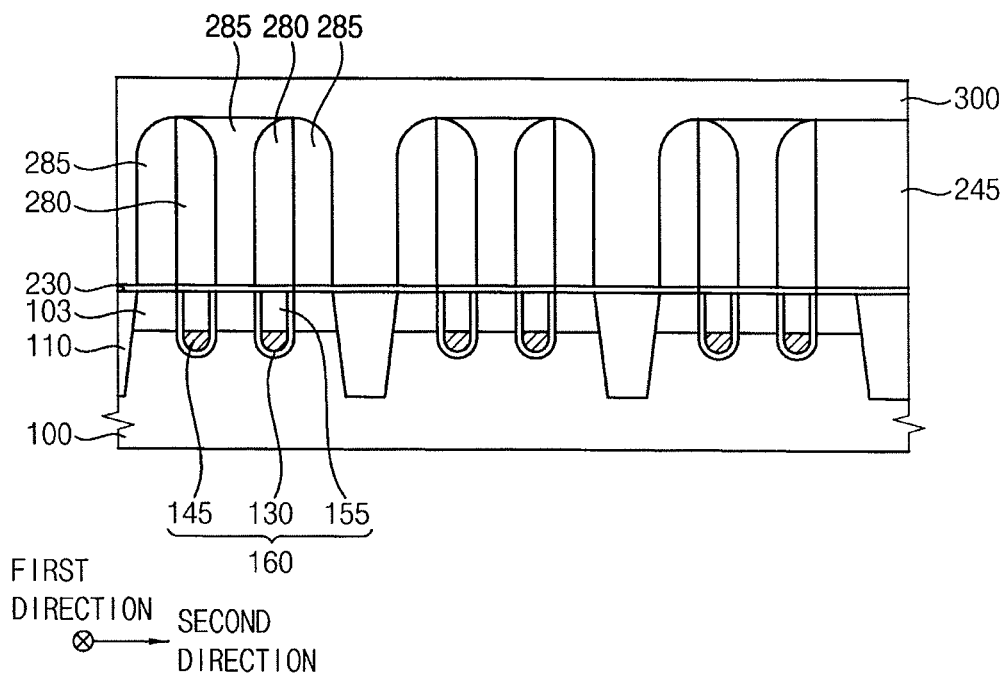

Referring to FIG. 12, a filling layer 300 may be formed on the first etch stop layer 230, the first spacers 280, the second spacers 285, and the first insulating interlayer pattern 245, and remaining portions of the fourth openings 243 may be filled.

In example embodiments, the filling layer 300 may be formed to include a material substantially the same as that of the second spacers 280, i.e., a nitride such as silicon nitride.

Figure 13:
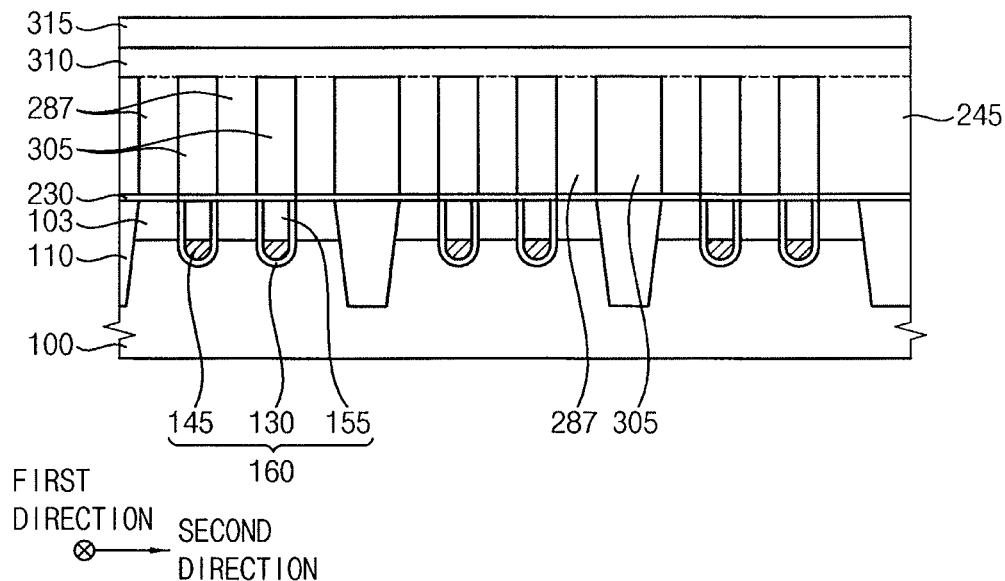

Referring to FIG. 13, an upper portion of the filling layer 300, upper portions of the first and second spacers 280 and 285, and an upper portion of the first insulating interlayer pattern 245 may be planarized, first and second patterns 305 and 287 may be formed, and second and third capping layers 310 and 315 may be sequentially formed.

In example embodiments, the planarization process may be performed by a CMP process and/or an etch back process.

According to the planarization process, the first spacers 280 and the filling layer 300 may be converted into the first patterns 305, and the second spacers 285 may be converted into the second patterns 287. Each of the first and second patterns 305 and 287 may extend in the first direction, and the first and second patterns 305 and 287 may be alternately and repeatedly formed in the second direction. The first and second patterns 305 and 287 may contact each other. In example embodiments, at least some of the first patterns 305 may overlap the gate structure 160, and the others of the first patterns 305 may overlap the isolation layer pattern 110. In example embodiments, the second patterns 287 may overlap the impurity region 103 adjacent to the gate structure 160.

The second capping layer 310 may be formed to include an oxide, e.g., silicon oxide. The second capping layer 310 may cover top surfaces of the first and second patterns 305 and 287 and a top surface of the first insulating interlayer pattern 245, and may be merged to the second patterns 287 and the first insulating interlayer pattern 245.

The third capping layer 315 may be formed to include a nitride, e.g., silicon nitride.

Figure 14:
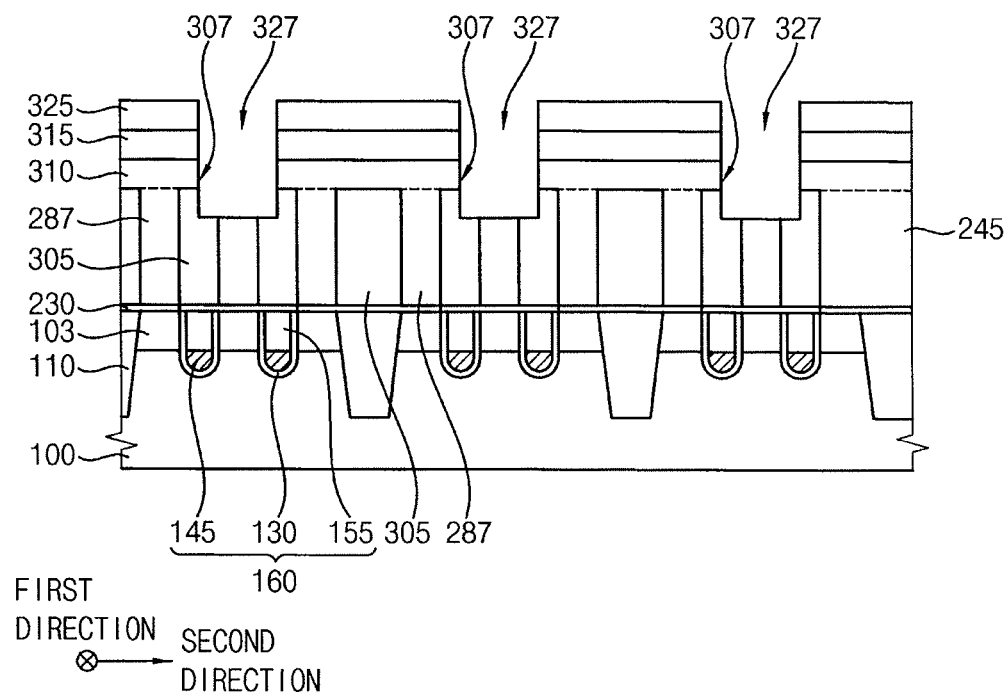

Referring to FIG. 14, a second photoresist pattern 325 may be formed on the third capping layer 315, the second and third capping layers 310 and 315 and upper portions of the first and second patterns 305 and 287 thereunder may be etched using the second photoresist pattern 325 as an etching mask, and recesses 307 may be formed.

In example embodiments, the second photoresist pattern 325 may include a fifth opening 327 exposing a portion of a top surface of the third capping layer 315. In example embodiments, the fifth opening 327 may extend in the first direction, and a plurality of fifth openings 327 may be formed in the second direction. Each fifth opening 327 may overlap the second pattern 287 on a portion of the substrate 100 between the gate structures 160 adjacent to each other in each active region and a portion of the first patterns 305 adjacent thereto, and the second patterns 287 on the substrate 100 between the gate structures 160 adjacent to each other in each active region may be exposed by the recesses 307.

Figure 15:
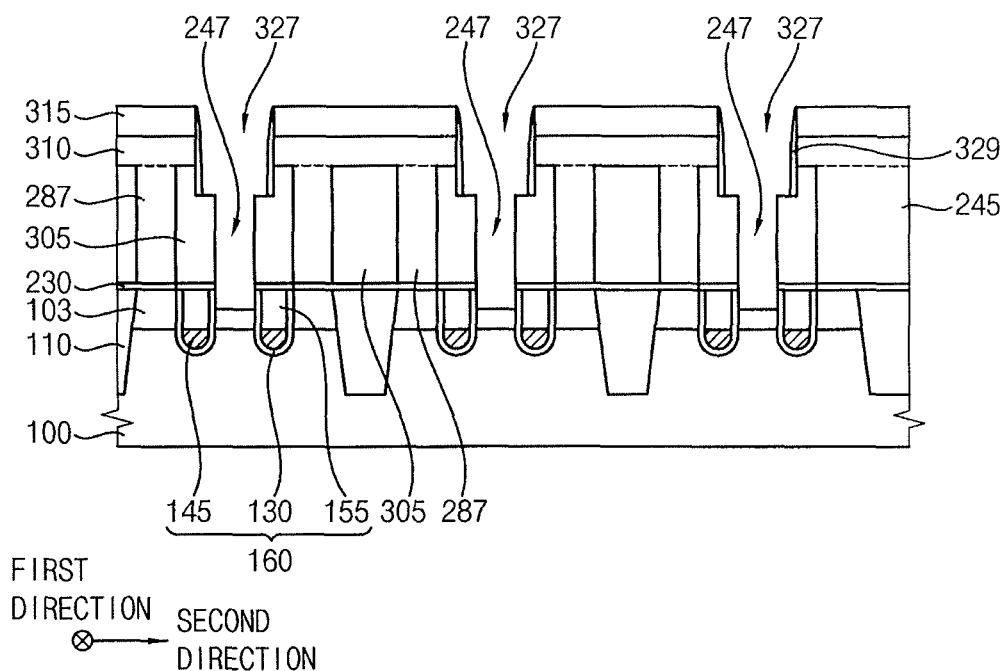

Referring to FIG. 15, the second photoresist pattern 325 may be removed, and a second etch stop layer pattern 329 may be formed on sidewalls of the second and third capping layers 310 and 315 and upper sidewalls of the first patterns 305 exposed by each recess 307.

The second etch stop layer pattern 329 may be formed by forming a second etch stop layer on inner walls of the recesses 307 and the top surface of the third capping layer 315, and etching the second etch stop layer anisotropically. The second etch stop layer pattern 329 may cover sidewalls of the second and third capping layers 310 and 315.

The second etch stop layer pattern 329 may be formed to include a material substantially the same as that of the first patterns 305 and/or the third capping layer 315, i.e., a nitride such as silicon nitride to be merged thereto.

The second patterns 287 exposed by the recesses 307 may be removed, portions of the first etch stop layer 230 thereunder may be removed, and sixth openings 247 exposing upper portions of the substrate 100 and being in communication with the recesses 307, respectively, may be formed. The exposed second patterns 287 may be removed by, e.g., a wet etching process, and the portions of the first etch stop layer 230 thereunder may be removed by, e.g., a dry etching process.

Each sixth opening 247 may be formed to extend in the first direction. The recess 307 and the sixth opening 247 in communication therewith may be referred to simply as a seventh opening for the convenience of explanation.

Figure 16:
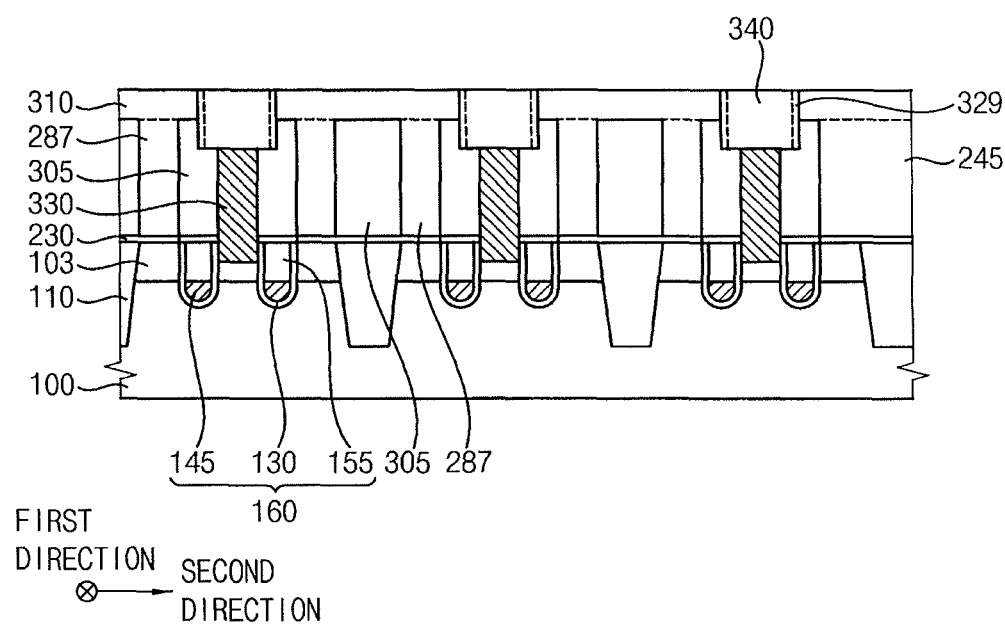

Referring to FIG. 16, a source line 330 may be formed, and each sixth opening 247 may be filled. A fourth capping layer pattern 340 may be formed on the source line 330, and each recess 307 may be filled.

The source line 330 may be formed by forming a first conductive layer on the exposed upper portions of the substrate 100, the sixth openings 247 and the recesses 307 may be filled, and an upper portion of the first conductive layer may be removed. In example embodiments, portions of the first conductive layer in the recesses 307 may be removed, each source line 330 may extend in the first direction, a plurality of source lines 330 may be formed in the second direction, and lower portions of each seventh opening may be filled. The first conductive layer may be formed to include a metal, e.g., tungsten (W), titanium (Ti), or tantalum (Ta), and a metal nitride, e.g., tungsten nitride (WN), titanium nitride (TiN), or tantalum nitride (TaN).

The fourth capping layer pattern 340 may be formed by forming a fourth capping layer on the source lines 330, the second etch stop layer patterns 329, and the third capping layer 31, the recesses 307 may be filled, and an upper portion of the fourth capping layer and the third capping layer 315 may be planarized until a top surface of the second capping layer 310 is exposed. The third capping layer 315 may be completely removed, and the fourth capping layer pattern 340 may fill the upper portions of the seventh openings. The fourth capping layer may be formed to include a nitride, e.g., silicon nitride, and the fourth capping layer pattern 340 may be merged to the first patterns 305 and/or the second etch stop layer patterns 329.

Thereafter, a third mask (not shown) may be formed on the substrate 100, and the second capping layer 310 and the second patterns 287 may be etched using the third mask as an etching mask. In example embodiments, the etching process may be performed by, e.g., a dry etching process. During the dry etching process, portions of the first etch stop layer 230 and the substrate 100 under the second patterns 287 may be also removed, and eighth openings (not shown) exposing upper portions of the substrate 100 may be formed.

A first insulating layer (not shown) may be formed on the substrate 100, the first patterns 305, the fourth capping layer patterns 340, and the third mask, the eighth openings may be sufficiently filled, an upper portion of the first insulating layer may be planarized until an upper portion of the third mask is removed, and third patterns (not shown) may be formed. The first insulating layer may be formed to include a nitride, e.g., silicon nitride, and may be merged to the first patterns 305, the fourth capping layer patterns 340, the second etch stop layer patterns 329, and the second capping layer 310. In example embodiments, each third pattern may be formed to extend in the second direction, and a plurality of third patterns may be formed in the first direction.

Figure 17:
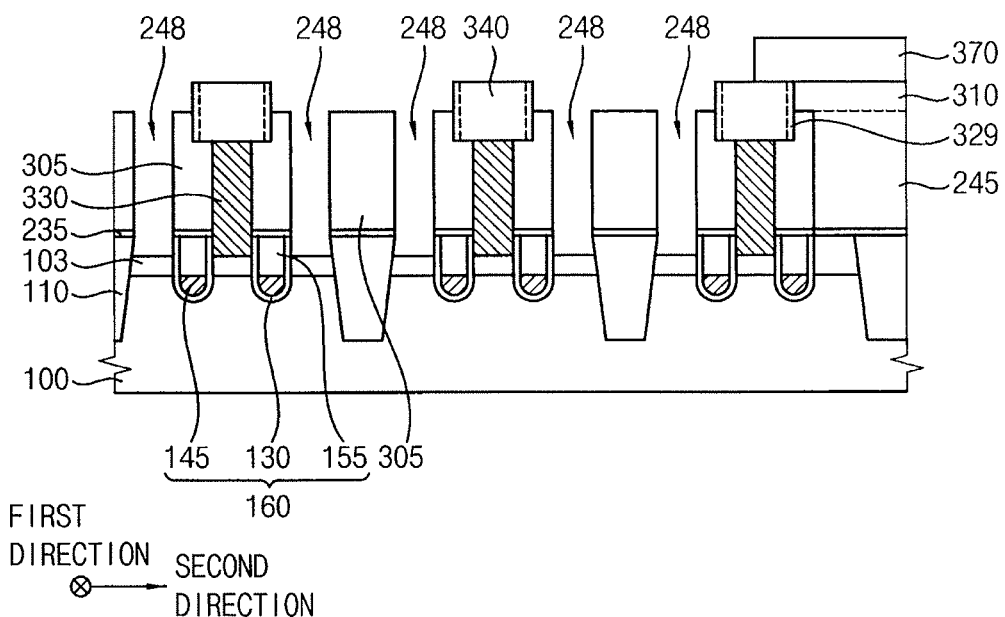

Referring to FIG. 17, a third photoresist pattern 370 may be formed on the second capping layer 310, portions of the fourth capping layer patterns 340 and the second etch stop layer pattern 329, and the third patterns, and the second capping layer 310 and the second patterns 287 thereunder may be etched using the third photoresist pattern 370 as an etching mask.

In example embodiments, the second capping layer 310 and the second patterns 287 may include a material having an etching selectivity with respect to the first patterns 305, the third patterns, the fourth capping layer patterns 340, and the second etch stop layer patterns 329, e.g., an oxide such as silicon oxide, and may be removed by performing a wet etching process.

Thereafter, portions of the first etch stop layer 230 exposed by the etching process may be removed by a dry etching process, and ninth openings 248 exposing portions of the top surface of the substrate 100 may be formed.

Figure 18:
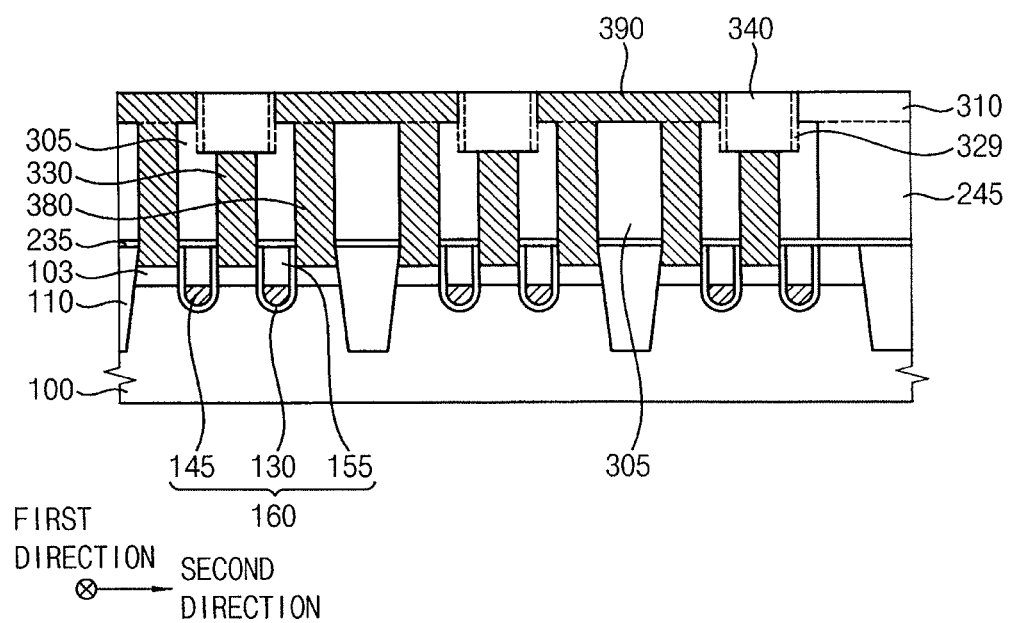

Referring to FIG. 18, the third photoresist pattern 370 may be removed by, e.g., a wet etching process, a contact plug 380 and a pad layer 390 may be formed, and each ninth opening 248 may be filled.

The contact plug 380 and the pad layer 390 may be formed by forming a second conductive layer on the substrate 100, the first patterns 305, the third patterns, the fourth capping layer pattern 340, and the second etch stop layer pattern 329, the ninth openings 248 may be filled, and an upper portion of the second conductive layer may be planarized until the top surface of the fourth capping layer pattern 340 is exposed. Upper portions of the planarized second conductive layer may serve as pad layer 390, and lower portions thereof may serve as the contact plug 380. The contact plug 380 and the pad layer 390 may be formed to include substantially the same material by a single process, and may be formed in a self-aligned manner. In addition, the contact plug 380 and the pad layer 390 may not be formed by separate processes, which may reduce the etching process for formation of fine patterns. The second conductive layer may include a metal and/or polysilicon doped with impurities.

In example embodiments, a plurality of contact plugs 380 may be formed both in the first and second directions, each of which may be formed to contact the impurity region 103. In example embodiments, a top surface of the pad layers 390 may be substantially coplanar with top surfaces of the third patterns, the fourth capping layer patterns 340, and the second etch stop layer patterns 329.

Figure 19:
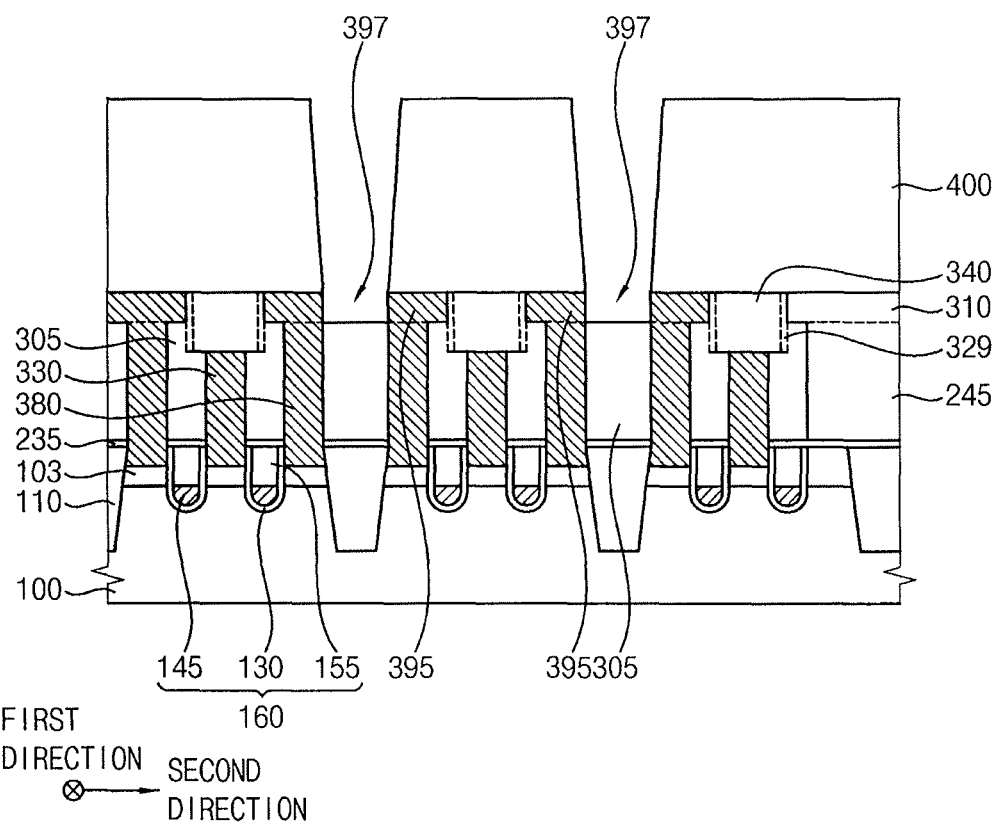

Referring to FIG. 19, a fourth mask 400 may be formed on the pad layers 390, the fourth capping layer patterns 340, and the second etch stop layer patterns 329, the pad layers 390 may be etched using the fourth mask 400 as an etching mask, and the pads 395 separated by a tenth opening 397 may be formed.

In example embodiments, the fourth mask 400 may expose portions of the pad layer 390 on the first patterns 305, each pad layer 390 may be divided into two pads 395 by the etching process, and the tenth openings 397 may expose portions of a top surface of the first patterns 305. A width of each pad 395 in the second direction may be greater than that of each contact plug 380.

Figure 20:
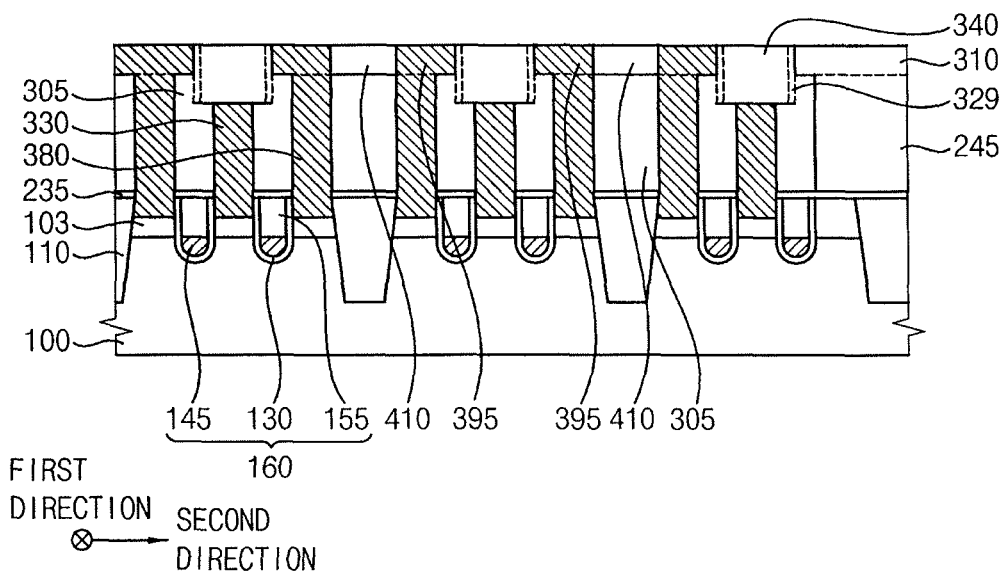

Referring to FIG. 20, a division layer pattern 410 may be formed, and each tenth opening 397 may be filled.

The division layer pattern 410 may be formed by removing the fourth mask 400, forming a second insulating layer on the third patterns, the pads 395, the fourth capping layer patterns 340, and the second etch stop layer patterns 329, the tenth opening 397 may be filled, and an upper portion of the second insulating layer may be planarized until a top surface of the pads 395 is exposed. The second insulating layer may be formed to include a nitride, e.g., silicon nitride.

Figure 21:
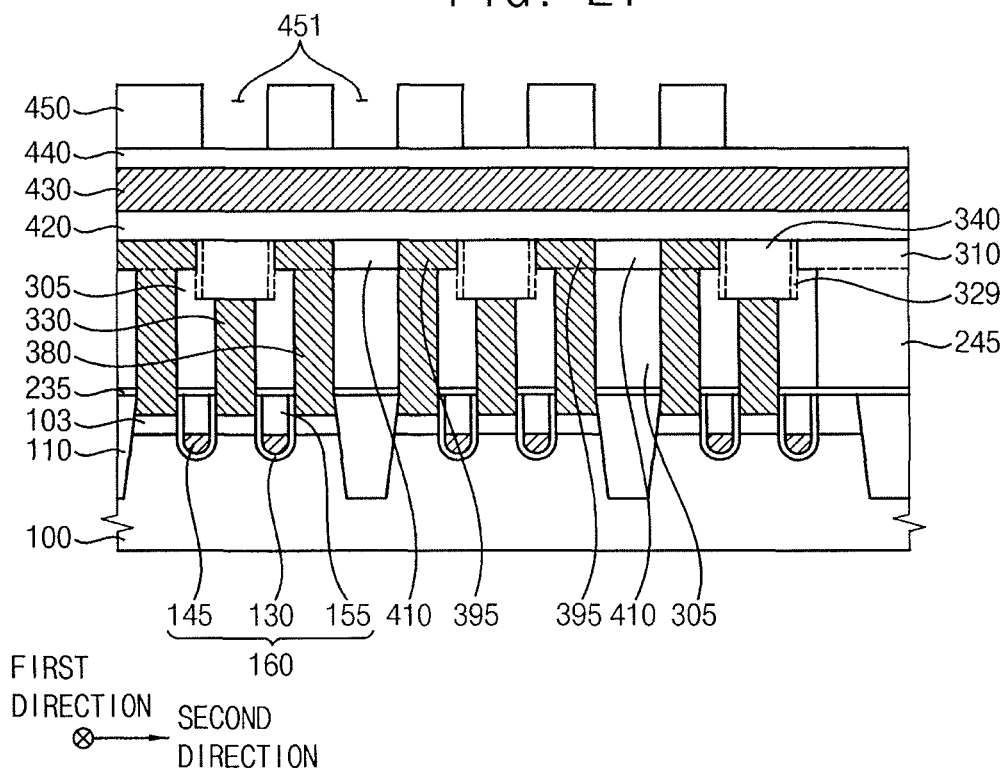

Referring to FIG. 21, a lower electrode layer 420, a first free layer 430, a sacrificial layer 440, and a hard mask 450 may be may be sequentially formed on the second and fourth capping layer patterns 310 and 340, the second etch stop layer patterns 329, the pads 395, and the division layer patterns 410.

The lower electrode layer 420 may be formed to include a conductive material, which may include a metal, e.g., tungsten, titanium, or tantalum, a metal nitride, e.g., tungsten nitride, titanium nitride, or tantalum nitride.

The first free layer 430 may be formed to include a ferromagnetic material, e.g., iron, nickel, or cobalt, and may have a first thickness. In example embodiments, the first free layer 430 may be formed to have a magnetization direction substantially vertical to the top surface of the substrate 100, or a magnetization direction substantially parallel to the top surface of the substrate 100.

The sacrificial layer 440 may be formed to include a material having an etching selectivity with respect to the first free layer 430, e.g., magnesium oxide. In an example embodiment, the sacrificial layer 440 may be formed to have a second thickness smaller than the first thickness.

The hard mask 450 may be formed to have an eleventh opening 451 partially exposing a top surface of the sacrificial layer 440. The eleventh opening 451 may be formed to overlap the source line 330 and the fourth capping layer pattern 340, or the isolation layer pattern 110 and the division layer pattern 410. In example embodiments, a plurality of hard masks 450 may be formed both in the first and second directions. The hard mask 450 may be formed to include a material having a high etching selectivity with respect to the sacrificial layer 440, the first free layer 430, and the lower electrode layer 420, e.g., polymer, an oxide, a metal and/or a metal nitride.

In some embodiments, before forming the sacrificial layer 440, a protection layer (not shown) may be further formed on the first free layer 430. The protection layer may be formed to include a material that may have a high etching selectivity with respect to the first free layer 430 and may not be reacted with deionized water.

Figure 22:
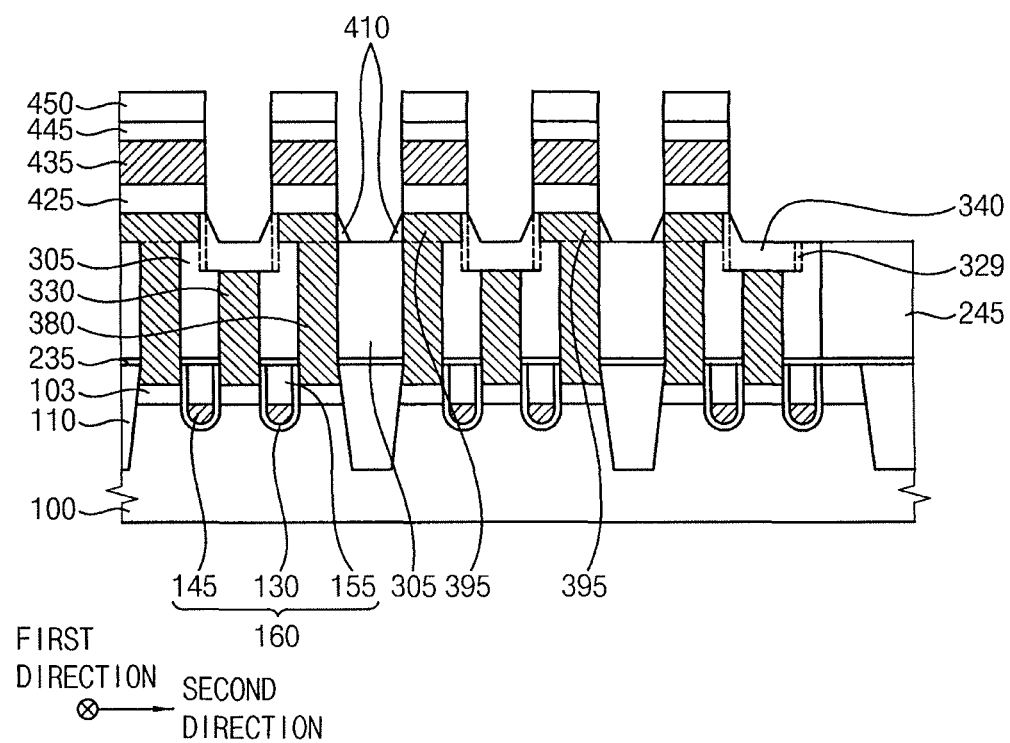

Referring to FIG. 22, the sacrificial layer 440, the first free layer 430, and the lower electrode layer 420 may be sequentially patterned using the hard mask 450 as an etching mask. The sacrificial layer 440, the first free layer 430, and the lower electrode layer 420 may be partially removed, and a lower electrode 425, a preliminary first free layer pattern 435, and a sacrificial layer pattern 445 sequentially stacked on the pad 395 may be formed. In example embodiments, a plurality of lower electrodes 425, a plurality of preliminary first free layer patterns 435, and a plurality of sacrificial layer patterns 445 may be formed both in the first and second directions.

In example embodiments, the patterning process may be performed by a physical etching process, e.g., a reactive plasma etching process or an ion sputtering process. The reactive plasma etching process may be performed using an etching gas including, e.g., hydrogen fluoride (HF) and/or ammonia ($NH_3$) and a reaction gas including, e.g., oxygen.

An upper portion of the hard mask 450 may be removed by the patterning process, and the second and fourth capping layer patterns 310 and 340, the second etch stop layer pattern 329, and the division layer pattern 410 overlapping the eleventh opening 451 may be partially removed. The second capping layer pattern 310 may be completely removed, and a top surface of the first insulating interlayer pattern 245 may be exposed. In example embodiments, the second and fourth capping layer patterns 310 and 340, the second etch stop layer pattern 329, and the division layer pattern 410 may not be removed, and top surfaces of the second and fourth capping layer patterns 310 and 340, the second etch stop layer pattern 329, and the division layer pattern 410 may be exposed.

Figure 23:
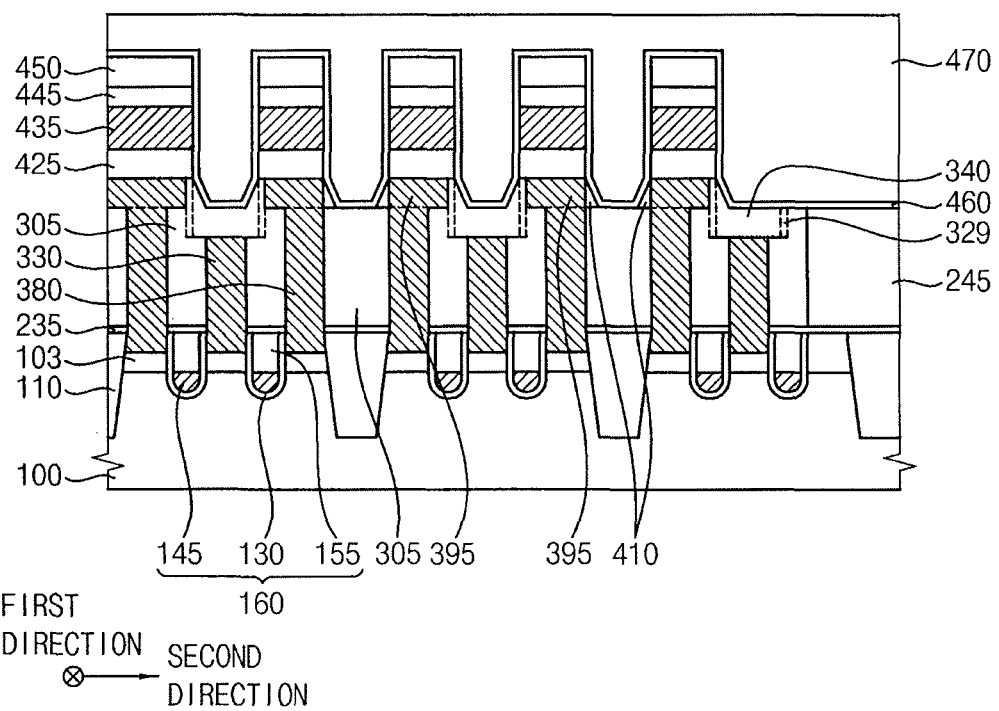

Referring to FIG. 23, a fifth capping layer 460 may be formed to cover the lower electrode 425, the preliminary first free layer pattern 435, the sacrificial layer pattern 445, and the hard mask 450. The fifth capping layer 460 may be also formed on the fourth capping layer pattern 340, the second etch stop layer pattern 329, the division layer pattern 410, the first pattern 305, and the first insulating interlayer pattern 245. The fifth capping layer 460 may be formed to include an oxide, e.g., aluminum oxide.

An oxide layer 470 may be formed on the fifth capping layer 460 to sufficiently cover the lower electrode 425, the preliminary first free layer pattern 435, the sacrificial layer pattern 445, and the hard mask 450. The oxide layer 470 may be formed to include, e.g., silicon oxide.

Figure 24:
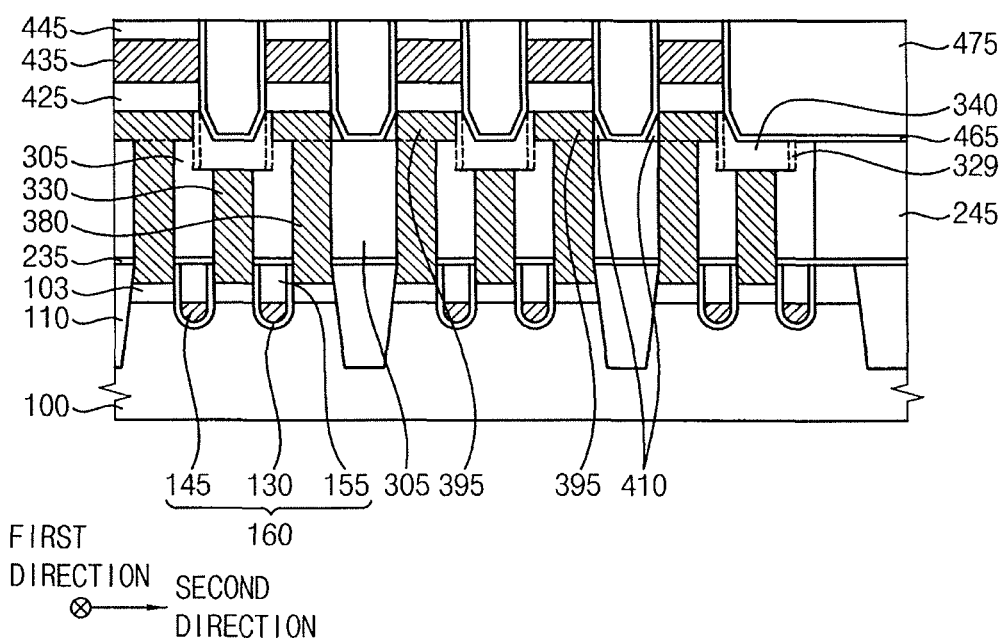

Referring to FIG. 24, the oxide layer 470 and the fifth capping layer 460 may be planarized until a top surface of the sacrificial layer pattern 445 is exposed. An oxide layer pattern 475 and a fifth capping layer pattern 465 covering a sidewall and a bottom of the oxide layer pattern 475 may be formed between neighboring structures each of which may include the sacrificial layer pattern 445, the preliminary first free layer pattern 435, and the lower electrode 425. The hard mask 450 may be completely removed by the planarization process.

In example embodiments, the planarization process may include a CMP process and/or an etch back process.

Figure 25:
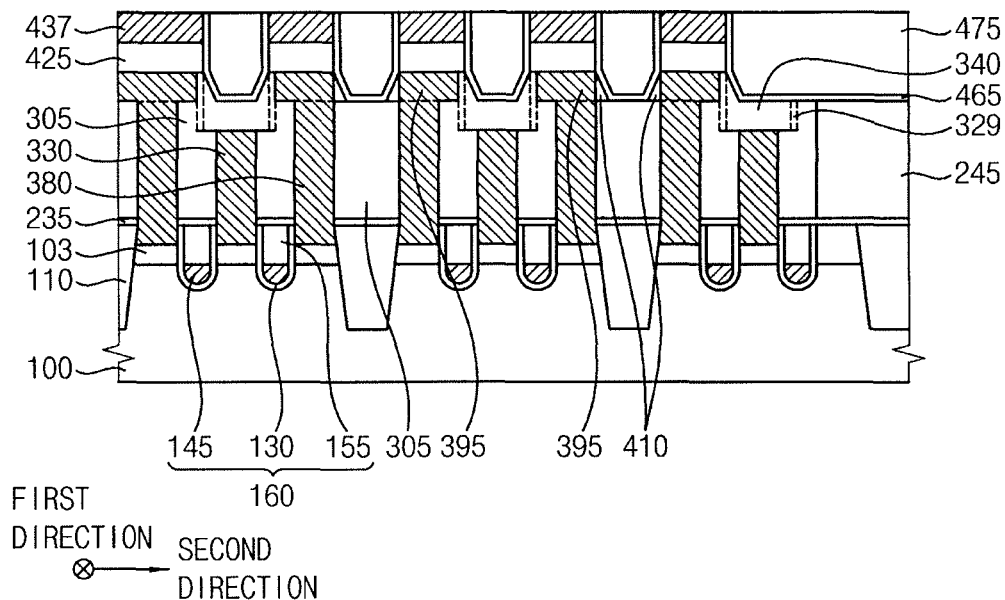

Referring to FIG. 25, after removing the sacrificial layer pattern 445, an upper portion of the preliminary first free layer pattern 435 thereunder may be removed and a first free layer pattern 437 may be formed. In example embodiments, a plurality of first free layer patterns 437 may be formed both in the first and second directions.

In example embodiments, the sacrificial layer pattern 445 may be removed by an ion sputtering process or a wet etching process using deionized water. During the wet etching process, a protection layer pattern (not shown) may be further formed on the preliminary first free layer pattern 435, and the preliminary first free layer pattern 435 may be protected.

The upper portion of the preliminary first free layer pattern 435 may be removed by, e.g., an ion sputtering process.

In example embodiments, the sacrificial layer pattern 445 and the upper portion of the preliminary first free layer pattern 435 may be simultaneously removed by an ion sputtering process.

When the ion sputtering process is performed, upper portions of the fifth capping layer pattern 465 and the oxide layer pattern 475 may be also removed.

Figure 26:
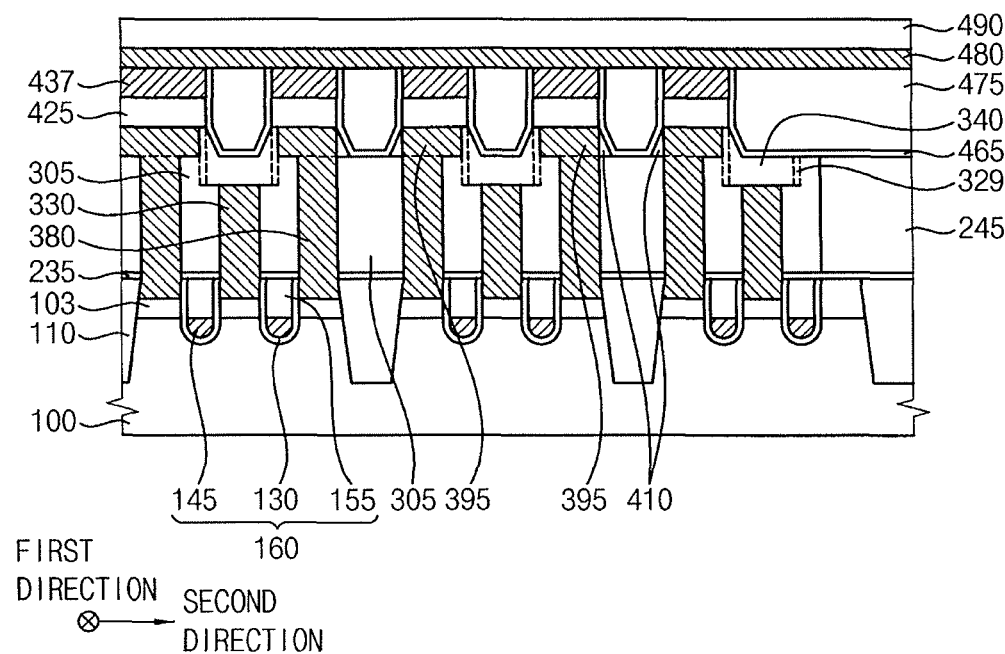

Referring to FIG. 26, a second free layer 480 and a tunnel barrier layer 490 may be sequentially formed on the first free layer pattern 437, the fifth capping layer pattern 465, and the oxide layer pattern 475.

The second free layer 480 may be formed to include a material substantially the same as that of the first free layer pattern 437, which may include a ferromagnetic material, e.g., iron, nickel, or cobalt, and the second free layer 480 may be formed to have a magnetization direction substantially the same as that of the first free layer pattern 437. In example embodiments, the magnetization direction of the second free layer 480 may be vertical or horizontal. The second free layer 480 may be formed to have a second thickness smaller than the first thickness. The first and second thicknesses may be changed according to a MTJ structure.

The tunnel barrier layer 490 may be formed to include a metal oxide, a metal nitride or a metal oxynitride, e.g., magnesium oxide or aluminum oxide. In an example embodiment, the tunnel barrier layer 490 may be formed to have a thickness of about 10 Å.

Figure 27:
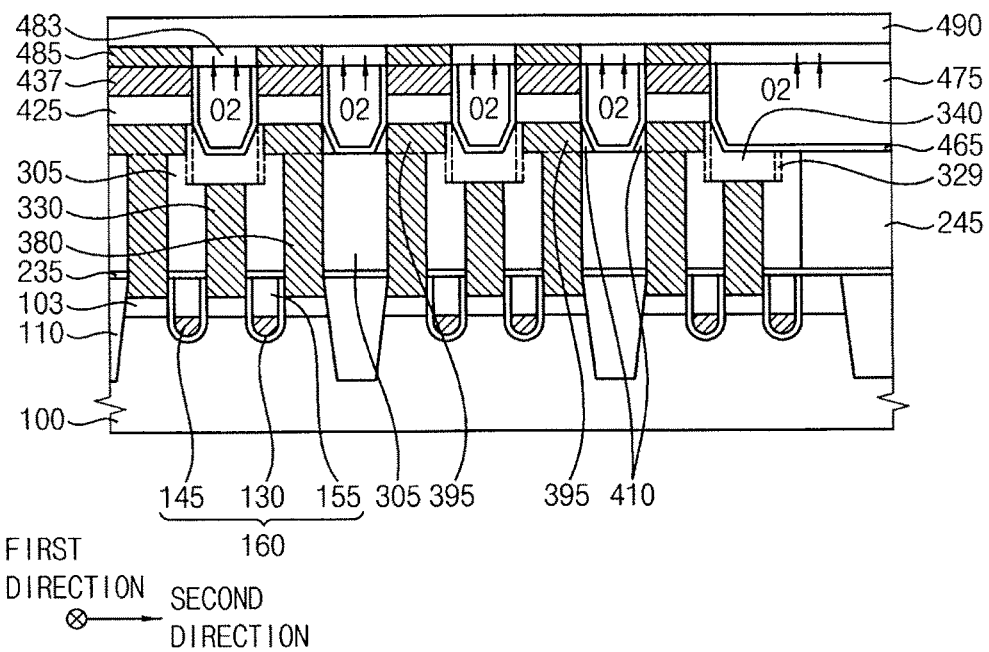

Referring to FIG. 27, oxygen ions included in the oxide layer pattern 475 may be diffused into the second free layer 480 to oxidize a portion of the second free layer 480. The oxygen ions may be naturally diffused, and the oxidized portion of the second free layer 480 may be converted into an insulative first metal oxide layer pattern 483, and other portions of the second free layer 480 may be referred to as a second free layer pattern 485. The second free layer pattern 485 may contact a top surface of the first free layer pattern 437, and in some cases, may be merged into the first free layer pattern 437. In example embodiments, a plurality of second free layer patterns 485 may be formed both in the first and second directions.

In example embodiments, a heat treatment process may be performed on the substrate 100 having the oxide layer pattern 475 and the second free layer 480 thereon, and the oxygen ions may be diffused into the second free layer 480. The second free layer may be formed to have a large thickness, and the heat treatment process may activate the diffusion of the oxygen ions.

Referring to FIG. 1 again, a fixed layer structure 500 and a wiring 510 may be formed on the tunnel barrier layer 490. The first and second free layer patterns 437 and 485, the tunnel barrier layer 490, and the fixed layer structure 500 may define a first magnetic tunnel junction (MTJ) structure 600.

In example embodiments, the fixed layer structure 500 may be formed to include a first pinning layer, an anti-ferromagnetic coupling spacer layer, and a second pinning layer sequentially stacked. The first and second pinning layers may be formed to include a ferromagnetic material, e.g., cobalt or palladium. The anti-ferromagnetic coupling spacer layer may be formed to include, e.g., ruthenium, iridium, or rhodium. The first and second pinning layers may have first and second magnetization directions, respectively, which are fixed and substantially opposite to each other. In example embodiments, the first and second magnetization directions may be vertical or horizontal.

The wiring 510 may contact a top surface of the fixed layer structure 500, and may include a metal, e.g., copper. In example embodiments, the wiring 510 may extend in the second direction, and a plurality of wirings 510 may be formed in the first direction.

As described above, the first free layer pattern 437 may be formed by a physical etching process, and the second free layer pattern 485 may be formed by partially oxidizing the second free layer 480 on the first free layer pattern 437 to easily form the first MTJ structure 600. The first and second free layer patterns 437 and 485 may not be simultaneously formed, and at least the second free layer pattern 485 may not be formed by a physical etching process, and no magnetic material may be attached onto sidewalls of the first and second free layer patterns 437 and 485 during the formation of the first MTJ structure 600.

After forming the first and second free layer patterns 437 and 485, the tunnel barrier layer 490 and the fixed layer structure 500 may be sequentially formed thereon. The physical etching process for forming the first MTJ structure 600 may be minimized or reduced, and an upper electrode may not be formed on the first MTJ structure 600.

Figure 28:
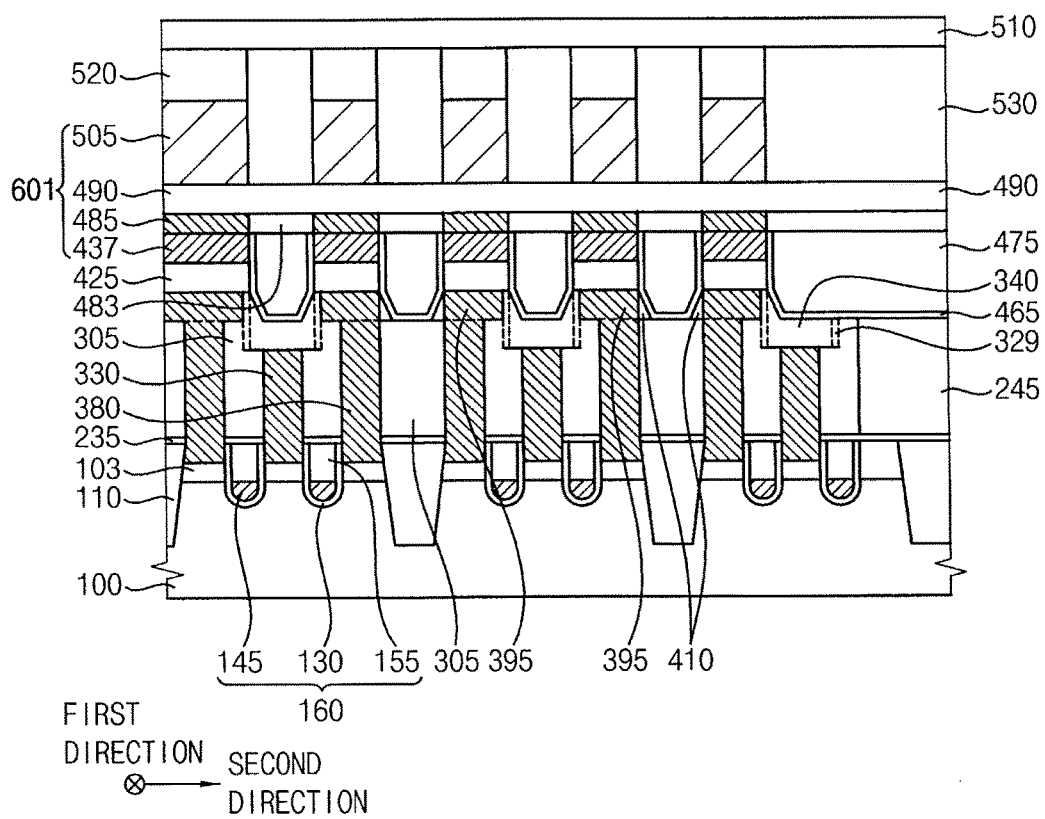
FIG. 28 illustrates a cross-sectional view of an MRAM device in accordance with example embodiments.

FIG. 28 illustrates a cross-sectional view of an MRAM device in accordance with example embodiments. The MRAM device may be substantially the same as that of FIG. 1, except for a fixed layer structure, an upper electrode, and a second insulating interlayer pattern. Like reference numerals refer to like elements, and detailed descriptions thereon are omitted here.

Referring to FIG. 28, the MRAM device may include a transistor having a gate structure 160 and an impurity region 103, a lower electrode 425, a second MTJ structure 601, an upper electrode 520, a second insulating interlayer pattern 530, and a wiring 510. The MRAM device may further include a source line 330, a contact plug 380, a pad 395, a first etch stop layer pattern 235, a first pattern 305, a first insulating interlayer pattern 245, a second etch stop layer pattern 329, fourth and fifth capping layer patterns 340 and 465, a division layer pattern 410, an oxide layer pattern 475, and a first metal oxide layer pattern 483.

The second MTJ structure 601 may include first and second free layer patterns 437 and 485, a tunnel barrier layer 490, and a fixed layer pattern structure 505 sequentially stacked on the lower electrode 425.

The fixed layer pattern structure 505 may be formed on the tunnel barrier layer 490 to overlap the lower electrode 425 and the first and second free layer patterns 437 and 485. In example embodiments, a plurality of fixed layer pattern structures 505 may be formed both in the first and second directions, and may include a first pinning layer pattern, an anti-ferromagnetic coupling spacer, and a second pinning layer pattern. The first and second pinning layer patterns may include a ferromagnetic material, e.g., cobalt or palladium, and the anti-ferromagnetic coupling spacer may include, e.g., ruthenium, iridium, or rhodium. The first and second pinning layer patterns may have first and second magnetization directions, respectively, which may be fixed and opposite to each other. In example embodiments, the first and second magnetization directions may be vertical or horizontal.

The upper electrode 520 may be formed on the fixed layer pattern structure 505 to contact a top surface thereof. The upper electrode 520 may include a conductive material substantially the same as that of the lower electrode 425, which may include a metal, e.g., tungsten, titanium, or tantalum, and/or a metal nitride, e.g., tungsten nitride, titanium nitride, or tantalum nitride. In example embodiments, a plurality of upper electrodes 520 may be formed both in the first and second directions.

The second insulating interlayer pattern 530 may be formed on the tunnel barrier layer 490 to cover sidewalls of the fixed layer pattern structure 505 and the upper electrode 520. The second insulating interlayer pattern 530 may include an oxide, e.g., BPSG, USG, or SOG.

The wiring 510 may be formed on the second insulating interlayer pattern 530 and the upper electrode 520 to contact a top surface of the upper electrode 520. The wiring 510 may include a metal, e.g., copper. In example embodiments, the wiring 510 may extend in the second direction, and a plurality of wirings 510 may be formed in the first direction.

Figure 29:
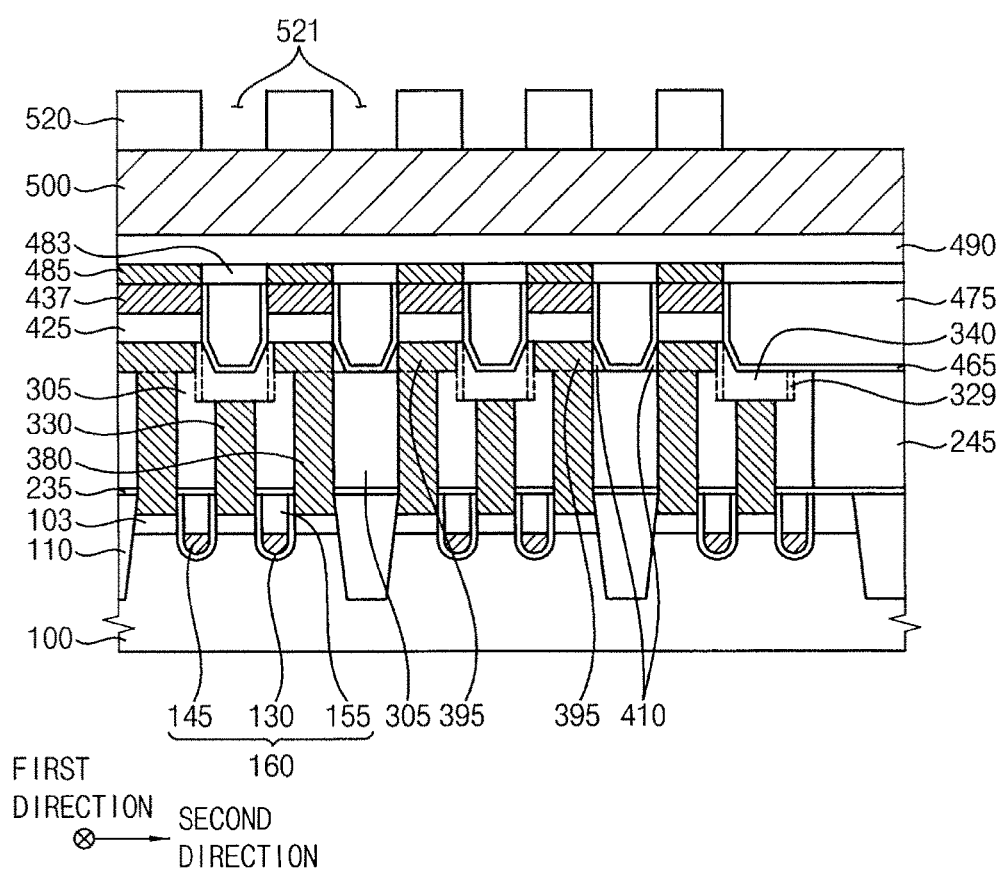
FIGS. 29 and 30 illustrate cross-sectional views of stages of a method of manufacturing an MRAM device in accordance with example embodiments.
Figure 30:
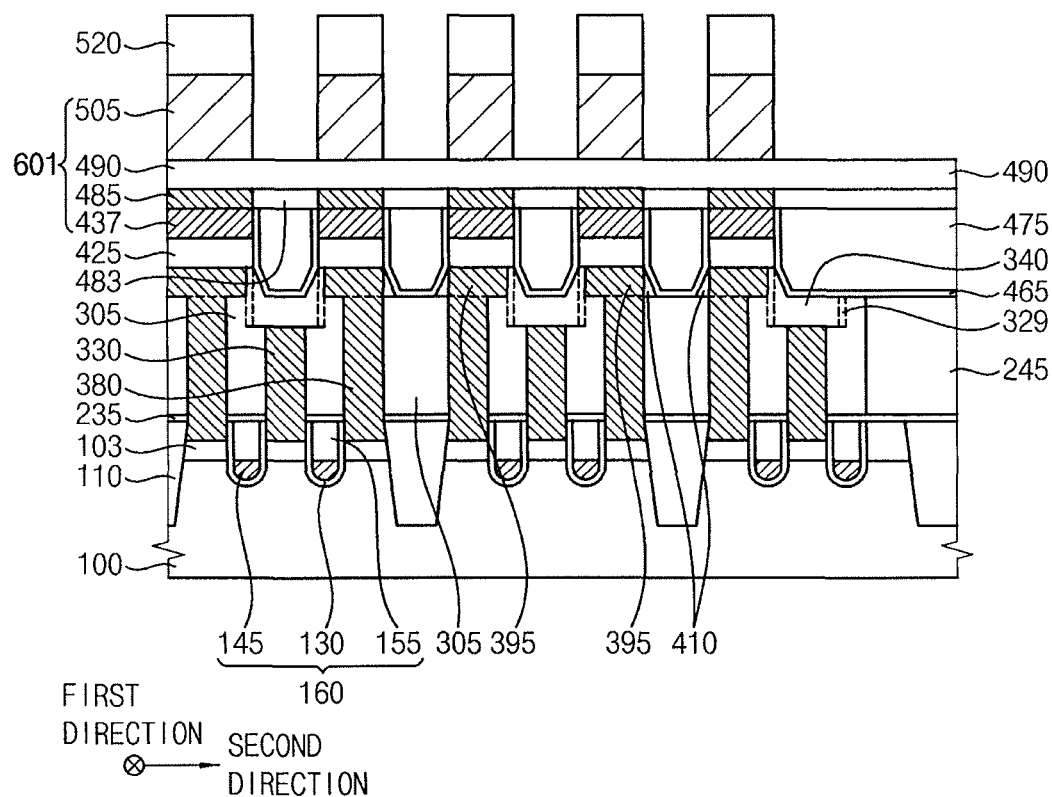

FIGS. 29 and 30 illustrate cross-sectional views of stages of a method of manufacturing an MRAM device in accordance with example embodiments. This method may be substantially the same as that illustrated with reference to FIGS. 2 to 27, except processes for forming a fixed layer pattern structure, an upper electrode, and a second insulating interlayer pattern. Like reference numerals refer to like elements, and detailed descriptions thereon are omitted here.

First, processes substantially the same as or similar to those illustrated with reference to FIGS. 2 to 27 may be performed. A transistor including a gate structure 160 and an impurity region 103, a source line 330, a contact plug 380, a pad 395, a first pattern 305, a first etch stop layer pattern 235, a first insulating interlayer pattern 245, a fourth capping layer pattern 340, a second etch stop layer pattern 329, and a division layer pattern 410 may be formed. Additionally, a lower electrode 425, first and second free layer patterns 437 and 485, a fifth capping layer pattern 465, an oxide layer pattern 475, a first metal oxide layer pattern 483, and a tunnel barrier layer 490 may be formed.

Referring to FIG. 29, a fixed layer structure 500 and an upper electrode 520 may be sequentially formed on the tunnel barrier layer 490.

The fixed layer structure 500 may be formed to include a first pinning layer, an anti-ferromagnetic coupling spacer layer, and a second pinning layer. The first and second pinning layers may be formed to include a ferromagnetic material, e.g., cobalt or palladium, and the anti-ferromagnetic coupling spacer layer may be formed to include, e.g., ruthenium, iridium, or rhodium. The first and second pinning layers may have first and second magnetization directions, respectively, which may be fixed and opposite to each other. In example embodiments, the first and second magnetization directions may be vertical or horizontal.

The upper electrode 520 may be formed to have a twelfth opening 521 partially exposing a top surface of the fixed layer structure 500. The twelfth opening 521 may overlap the first metal oxide layer pattern 483 and the oxide layer pattern 475. In example embodiments, a plurality of upper electrodes 520 may be formed both in the first and second directions. The upper electrode 520 may be formed to include a conductive material substantially the same as that of the lower electrode 425, which may include a metal, e.g., tungsten, titanium, or tantalum, and/or a metal nitride, e.g., tungsten nitride, titanium nitride, or tantalum nitride.

Referring to FIG. 30, the fixed layer structure 500 may be patterned using the upper electrode 520 as an etching mask, a fixed layer pattern structure 505 overlapping the first and second free layer patterns 437 and 485 may be formed, and a top surface of the tunnel barrier layer 490 may be partially exposed. In example embodiments, a plurality of fixed layer pattern structures 505 may be formed both in the first and second directions.

In example embodiments, the patterning process may be performed by a physical etching process, e.g., a reactive plasma etching process or an ion sputtering process. The reactive plasma etching process may be performed using an etching gas including, e.g., hydrogen fluoride (HF) and/or ammonia ($NH_3$), and a reaction gas including, e.g., oxygen.

The fixed layer pattern structure 505 together with the first and second free layer patterns 437 and 485 and the tunnel barrier layer 490 may define a second MTJ structure 601.

Referring to FIG. 28 again, a second insulating interlayer covering the fixed layer pattern structure 505 and the upper electrode 520 may be formed, and an upper portion of the second insulating interlayer may be planarized until a top surface of the upper electrode 520 is exposed to form a second insulating interlayer pattern 530. A wiring 510 may be formed on the upper electrode 520 and the second insulating interlayer pattern 530.

The second insulating interlayer pattern 530 may be formed to include an oxide, e.g., BPSG, USG, or SOG.

The wiring 510 may be formed to include a metal, e.g., copper, and may contact a top surface of the upper electrode 520. In example embodiments, the wiring 510 may extend in the second direction, and a plurality of wirings 510 may be formed in the first direction.

Figure 31:
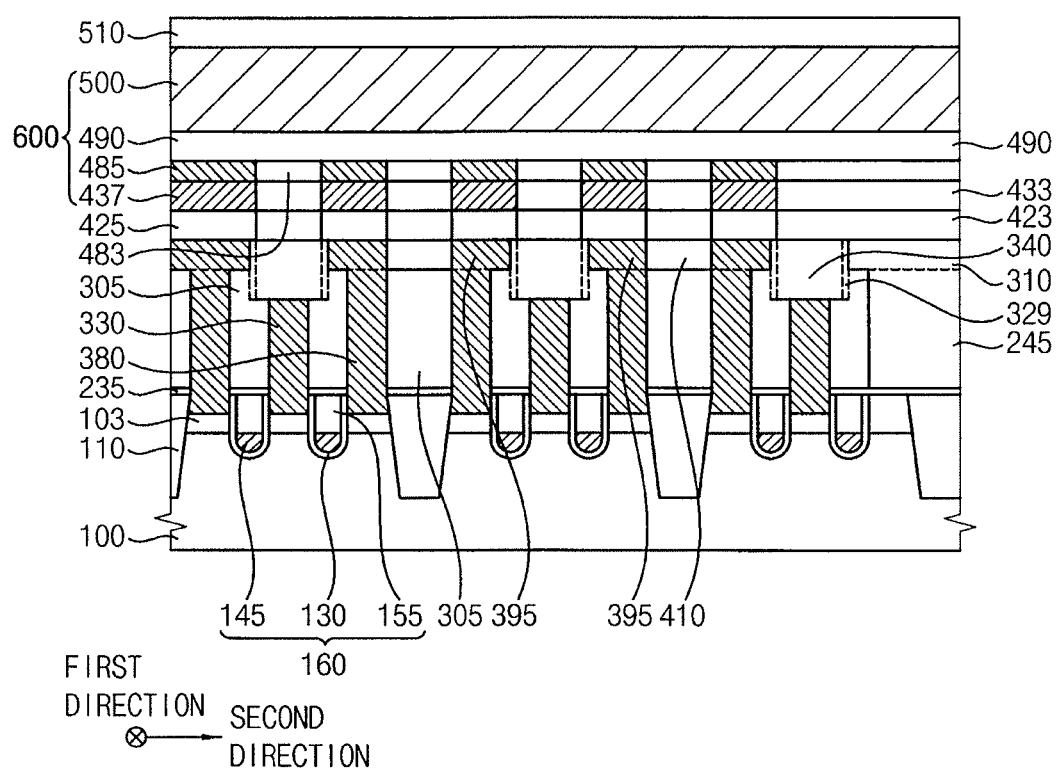
FIG. 31 illustrates a cross-sectional view of an MRAM device in accordance with example embodiments.

FIG. 31 illustrates a cross-sectional view of an MRAM device in accordance with example embodiments. The MRAM device may be substantially the same as that of FIG. 1, except for second and third metal oxide layer patterns and a second capping layer pattern. Like reference numerals refer to like elements, and detailed descriptions thereon are omitted here.

Referring to FIG. 31, the MRAM device may include a transistor having a gate structure 160 and an impurity region 103, a lower electrode 425, a first MTJ structure 600, a wiring 510, and first, second and third metal oxide layer patterns 483, 433 and 423. The MRAM device may further include a source line 330, a contact plug 380, a pad 395, a first etch stop layer pattern 235, a first pattern 305, a first insulating interlayer pattern 245, a second etch stop layer pattern 329, second and fourth capping layer patterns 310 and 340, and a division layer pattern 410.

The first MTJ structure 600 may include first and second free layer patterns 437 and 485, a tunnel barrier layer 490, and a fixed layer structure 500 sequentially stacked on the lower electrode 425.

The first metal oxide layer pattern 483 may be formed on a substrate 100, and may overlap the division layer pattern 410, the fourth capping layer pattern 340, the second etch stop layer pattern 329, and the first insulating interlayer pattern 245, and cover a sidewall of the second free layer pattern 485. The first metal oxide layer pattern 483 may include oxygen and a material substantially the same as that of the second free layer pattern 485, which may include a ferromagnetic material, e.g., cobalt, iron, or nickel. The first metal oxide layer pattern 483 may have a third thickness.

The second metal oxide layer pattern 433 may be formed on the substrate 100, and may overlap the division layer pattern 410, the fourth capping layer pattern 340, the second etch stop layer pattern 329, and the first insulating interlayer pattern 245, and cover a sidewall of the first free layer pattern 437. The second metal oxide layer pattern 433 may include oxygen and a material substantially the same as that of the first free layer pattern 437, which may include a ferromagnetic material, e.g., cobalt, iron, or nickel. In example embodiments, the second metal oxide layer pattern 433 may include a material substantially the same as that of the first metal oxide layer pattern 483, and may have a fourth thickness greater than the third thickness. The third and fourth thicknesses may be changed according to the first MTJ structure.

The third metal oxide layer pattern 423 may be formed on the division layer pattern 410, the fourth capping layer pattern 340, the second etch stop layer pattern 329, and the first insulating interlayer pattern 245, and may cover a sidewall of the lower electrode 425. The third metal oxide layer pattern 423 may include oxygen and a material substantially the same as that of the lower electrode 425, which may include a metal, e.g., tungsten, titanium, or tantalum, and/or a metal nitride, e.g., tungsten nitride, titanium nitride, or tantalum nitride. The third metal oxide layer pattern 423, the second metal oxide layer pattern 433, and the first metal oxide layer pattern 483 may be sequentially stacked on the substrate 100.

The second capping layer pattern 310 may be formed on the first insulating interlayer pattern 245 and the first pattern 305 contacting a sidewall of the first insulating interlayer pattern 245, and a sidewall of the second capping layer pattern 310 may contact the second etch stop layer pattern 329. The second capping layer pattern 310 may include an oxide, e.g., silicon oxide.

Figure 32:
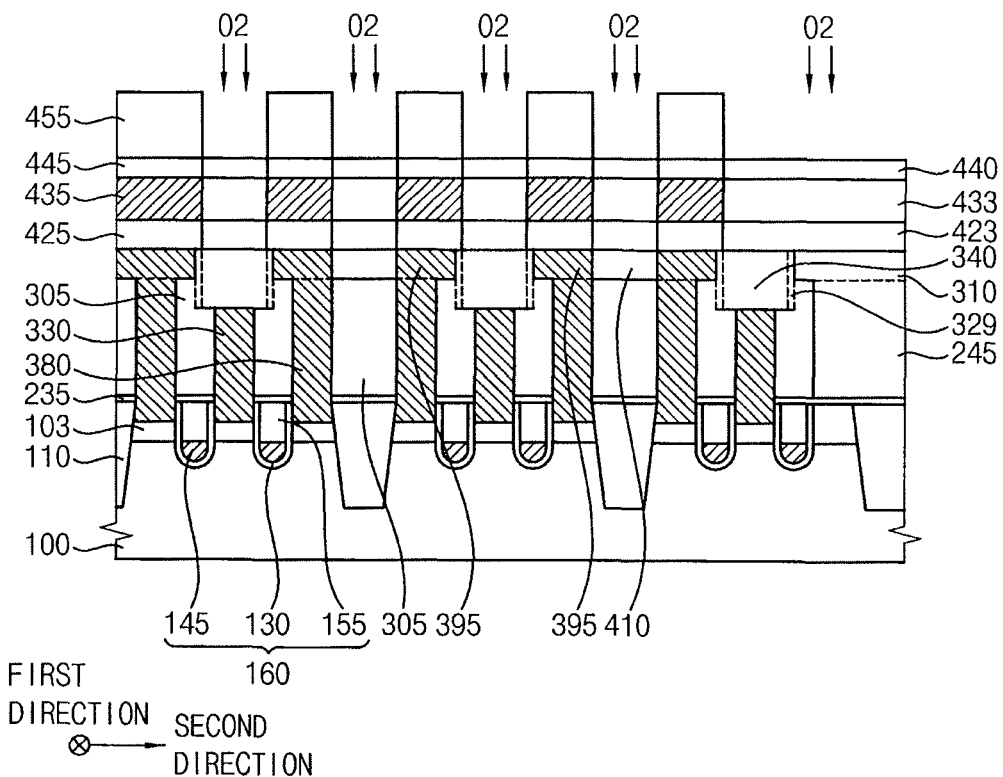
FIGS. 32 and 35 illustrate cross-sectional views of stages of a method of manufacturing an MRAM device in accordance with example embodiments.
Figure 35:
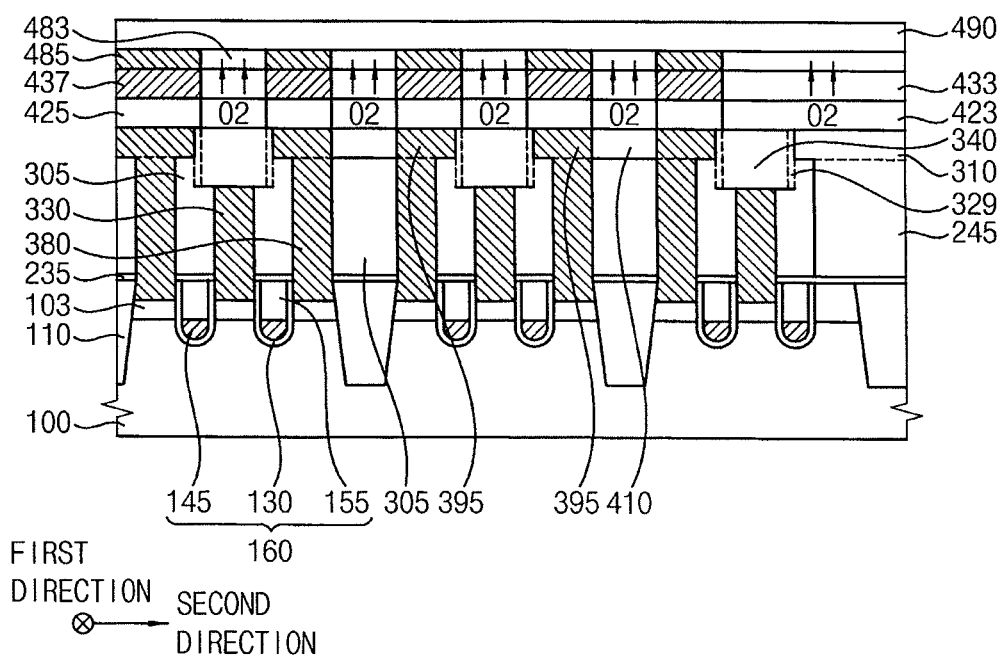

FIGS. 32 and 35 illustrate cross-sectional views of stages of a method of manufacturing an MRAM device in accordance with example embodiments. This method may be substantially the same as that illustrated with reference to FIGS. 2 to 21, except processes for forming first to third metal oxide layer patterns, a lower electrode, and first and second free layer patterns. Like reference numerals refer to like elements, and detailed descriptions thereon are omitted here.

First, processes substantially the same as or similar to those illustrated with reference to FIGS. 2 to 21 may be performed. A transistor including a gate structure 160 and an impurity region 103, a source line 330, a contact plug 380, a pad 395, a first pattern 305, a first etch stop layer pattern 235, a first insulating interlayer pattern 245, second and fourth capping layer patterns 310 and 340, a second etch stop layer pattern 329, and a division layer pattern 410 may be formed. Additionally, a lower electrode layer 420, a first free layer 430, a sacrificial layer 440, and a mask 455 may be formed. The mask 455 may be formed by a process for forming the hard mask 450 shown in FIG. 21, and may be formed to include, for example, a polymer, an oxide, a nitride, a metal, a metal oxide, a metal nitride, or a photosensitive material.

Referring to FIG. 32, an ion implantation process may be performed using the mask 455 as an ion implantation mask to implant oxygen ions into the sacrificial layer 440, the first free layer 430, and the lower electrode layer 420. The first free layer 430 and the lower electrode layer 420 may be partially oxidized, and the sacrificial layer 440 may include oxygen ions. The oxidized portions of the first free layer 430 and the lower electrode layer 420 may be converted into insulative second and third metal oxide layer patterns 433 and 423, and other portions thereof may be referred to as a preliminary first free layer pattern 435 and a lower electrode 425. A portion of the sacrificial layer 440 covered by the mask 455 may be converted into a sacrificial layer pattern 445.

In some embodiments, after performing the ion implantation process, a heat treatment process may be further performed on the substrate 100.

Figure 33:
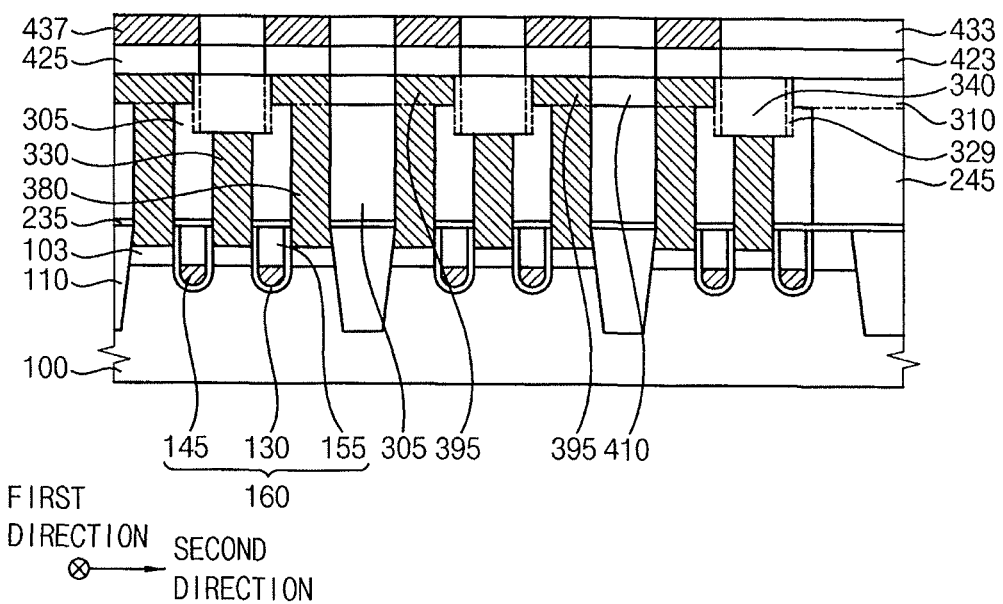

Referring to FIG. 33, a process substantially the same as or similar to that illustrated with reference to FIG. 25 may be performed. The mask 455 may be removed by, e.g., an ion sputtering process or a wet etching process, and after removing the sacrificial layer pattern 445, an upper portion of the first free layer pattern 435 thereunder may be removed, and a first free layer pattern 437 may be formed.

In example embodiments, the sacrificial layer pattern 445 may be removed by an ion sputtering process or a wet etching process using deionized water. The ion sputtering process may be performed, and not only the sacrificial layer pattern 445 but also the portion of the sacrificial layer 440 doped with oxygen may be removed.

The upper portion of the preliminary first free layer pattern 435 may be removed by an ion sputtering process, and an upper portion of the second metal oxide layer pattern 433 may be also removed.

In example embodiments, the mask 455, the sacrificial layer pattern 445, and the preliminary first free layer pattern 435 may be simultaneously removed. In this case, an ion sputtering process may be performed on the substrate 100.

Figure 34:
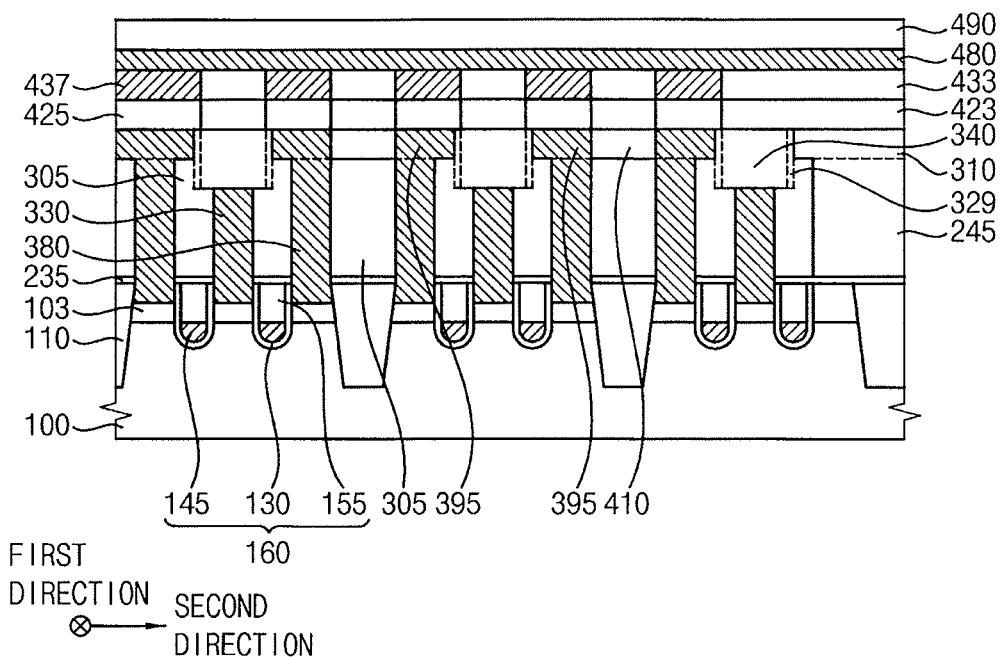

Referring to FIG. 34, a process substantially the same as or similar to that illustrated with reference to FIG. 26 may be performed, and a second free layer 480 and a tunnel barrier layer 490 may be sequentially formed.

Referring to FIG. 35, a process substantially the same as or similar to that illustrated with reference to FIG. 27 may be performed. Oxygen ions included in the second and third metal oxide layer patterns 433 and 423 may be diffused into the second free layer 480 so as to partially oxidize the second free layer 480. The oxygen ions may be naturally diffused, and a portion of the second free layer 480 oxidized by the oxygen ions may be converted into an insulative first metal oxide layer pattern 483, and other portions thereof may be referred to as a second free layer pattern 485. The second free layer pattern 485 may contact a top surface of the first free layer pattern 437, and in some cases, may be merged into the first free layer pattern 437. In example embodiments, a plurality of second free layer patterns 485 may be formed both in the first and second directions.

In example embodiments, a heat treatment process may be further performed on the substrate 100 having the second and third metal oxide layer patterns 433 and 423 and the second free layer 480 thereon, and oxygen ions may be diffused into the second free layer 480.

Referring to FIG. 31 again, a process substantially the same as or similar to that illustrated with reference to FIG. 1 may be performed to form a fixed layer structure 500 and a wiring 510. The MRAM device including the first MTJ structure 600 and the first to third metal oxide layer patterns 483, 433 and 423 may be manufactured.

As described above, only an ion implantation process may be performed to form the lower electrode 425 and the first and second free layer patterns 437 and 485, and the first MTJ structure 600 may be easily formed. The lower electrode 425 and the first and second free layer patterns 437 and 485 may not be formed by a physical etching process but formed by partially oxidizing the lower electrode layer 420 and the first and second free layers 430 and 480, and no magnetic material may be attached onto a sidewall of the first MTJ structure 600.

Additionally, a CMP process that may not be easily controlled may be skipped, and a physical etching process required for forming the first MTJ structure 600 may be reduced or minimized. No upper electrode may be formed so as to simplify the process and increase the efficiency of process.

Figure 36:
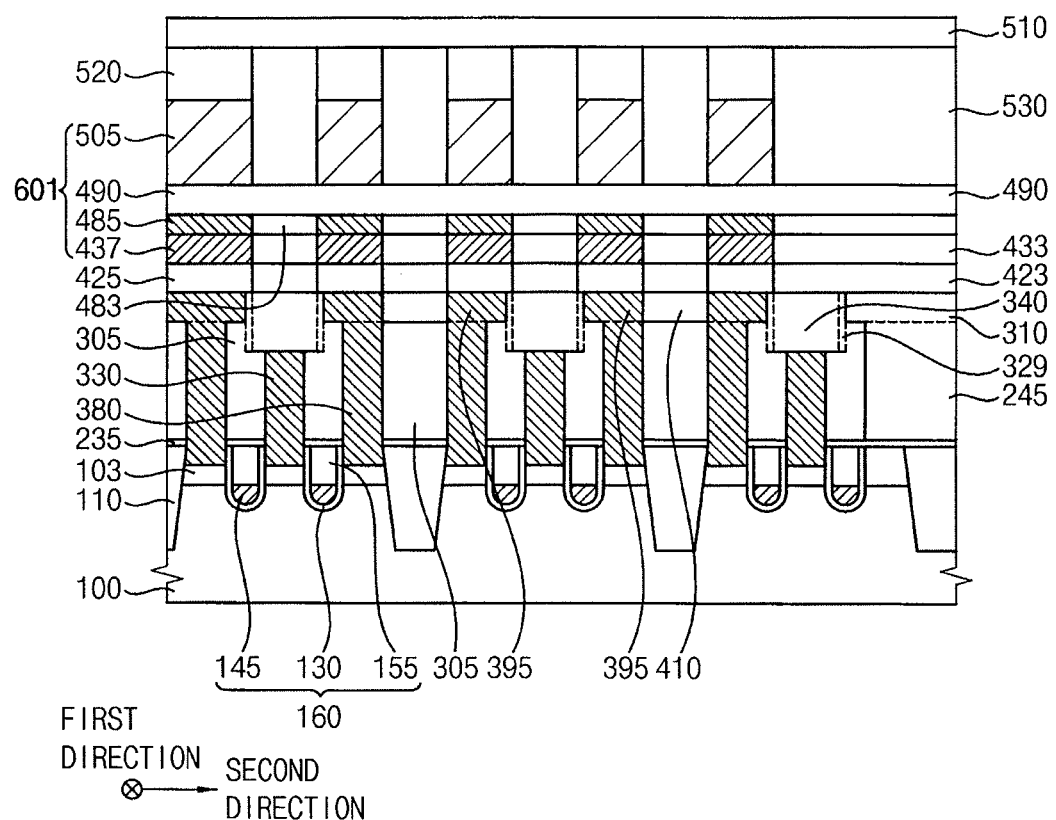
FIG. 36 illustrates a cross-sectional view of an MRAM device in accordance with example embodiments.

FIG. 36 illustrates a cross-sectional view of an MRAM device in accordance with example embodiments. The MRAM device may be substantially the same as that of FIG. 31, except for a fixed layer pattern structure, an upper electrode, and a second insulating interlayer pattern, and may be substantially the same as that of FIG. 28, except for second and third metal oxide layer patterns and a second capping layer pattern. Like reference numerals refer to like elements, and detailed descriptions thereon are omitted here.

Referring to FIG. 36, the MRAM device may include a transistor having a gate structure 160 and an impurity region 103, a lower electrode 425, a second MTJ structure 601, an upper electrode 520, and a wiring 510. The second MTJ structure 601 may include first and second free layer patterns 437 and 485, a tunnel barrier layer 490, and a fixed layer pattern structure 505. The MRAM device may further include a source line 330, a contact plug 380, a pad 395, a first etch stop layer pattern 235, a first pattern 305, a first insulating interlayer pattern 245, a second etch stop layer pattern 329, second and fourth capping layer patterns 310 and 340, a division layer pattern 410, first to third metal oxide layer patterns 483, 433 and 423, and a second insulating interlayer pattern 530.

Figure 37:
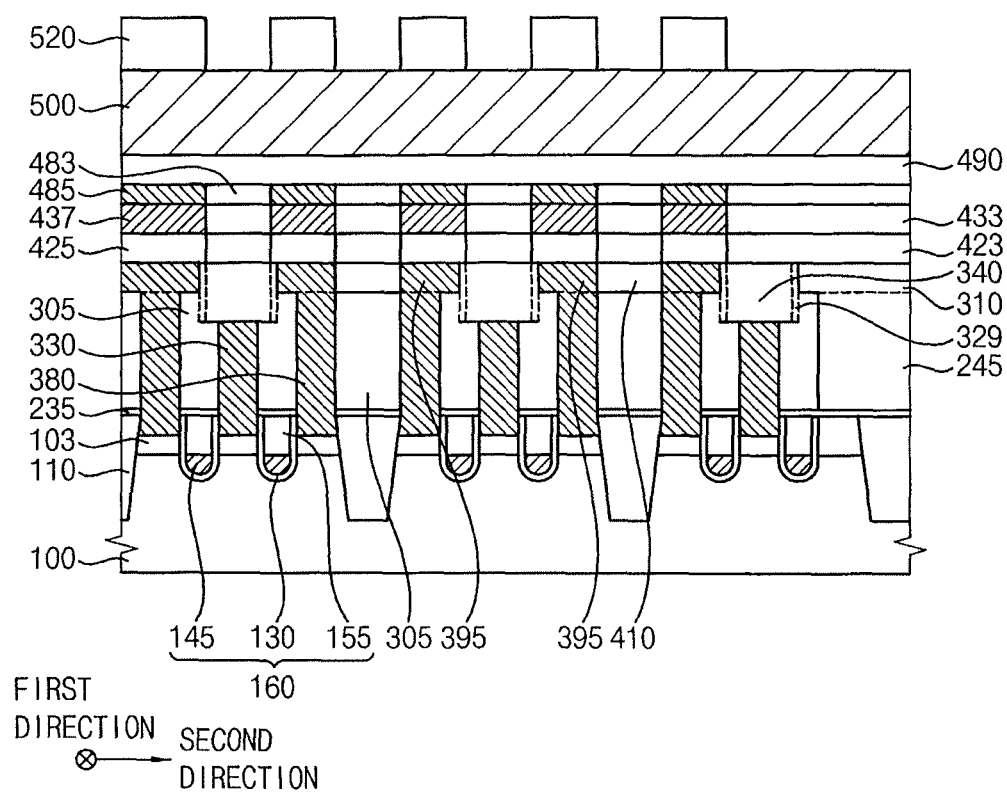
FIGS. 37 and 38 illustrate cross-sectional views' of stages of a method of manufacturing an MRAM device in accordance with example embodiments.
Figure 38:
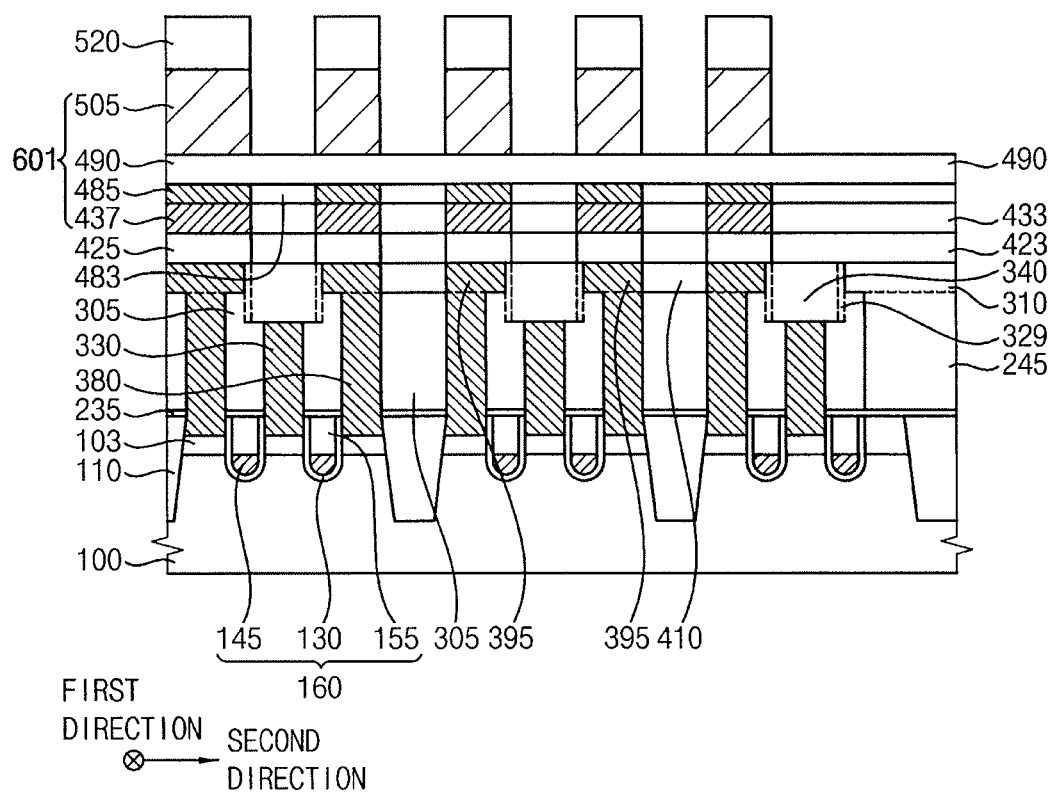

FIGS. 37 and 38 illustrate cross-sectional views of stages of a method of manufacturing an MRAM device in accordance with example embodiments. This method may be substantially the same as that illustrated with reference to FIGS. 32 to 35, except processes for forming a fixed layer pattern structure, an upper electrode, and a second insulating interlayer pattern, and may be substantially the same as that illustrated with reference to FIGS. 29 and 30, except processes for forming first to third metal oxide layer patterns, a lower electrode, and first and second free layer patterns. Like reference numerals refer to like elements, and detailed descriptions thereon are omitted here.

First, processes substantially the same as or similar to those illustrated with reference to FIGS. 2 to 21 may be performed. A transistor including a gate structure 160 and an impurity region 103, a source line 330, a contact plug 380, a pad 395, a first pattern 305, a first etch stop layer pattern 235, a first insulating interlayer pattern 245, second and fourth capping layer patterns 310 and 340, a second etch stop layer pattern 329, and a division layer pattern 410 may be formed.

Next, processes substantially the same as or similar to those illustrated with reference to FIGS. 32 to 35 may be performed. A lower electrode 425, first and second free layer patterns 437 and 485, first to third metal oxide layer patterns 483, 433 and 423, and a tunnel barrier layer 490 may be formed.

Referring to FIG. 37, a process substantially the same as or similar to that illustrated with reference to FIG. 29 may be performed. A fixed layer structure 500 and an upper electrode 520 may be sequentially formed.

Referring to FIG. 38, a process substantially the same as or similar to that illustrated with reference to FIG. 30 may be performed. A fixed layer pattern structure 505 may be formed.

Referring to FIG. 36 again, a process substantially the same as or similar to that illustrated with reference to FIG. 28 may be performed to form a second insulating interlayer pattern 530 and a wiring 510. The MRAM device including a second MTJ structure 601 and first to third metal oxide layer patterns 483, 433 and 423 may be manufactured.

By way of summation and review, an MTJ structure may be formed by sequentially forming a lower electrode layer, a fixed layer structure, a tunnel barrier layer, a free layer, and an upper electrode layer on a substrate, etching the upper electrode layer to form an upper electrode, and patterning the above layers using an etching mask by a physical etching process, e.g., an ion sputtering process to form a lower electrode, a fixed layer pattern structure, a tunnel barrier layer pattern, and a free layer pattern sequentially stacked.

When the physical etching process is performed, magnetic material of the fixed layer structure and/or the free layer may be re-sputtered and attached onto a sidewall of the tunnel barrier layer pattern of the MTJ structure, and the fixed layer pattern structure and the free layer pattern of the MTJ structure may have an electrical short.

In embodiments, after forming a lower electrode layer, a first free layer, and a sacrificial layer on a substrate, the lower electrode layer, first free layer, and sacrificial layer may be patterned by a physical etching process or an ion implantation process to form a lower electrode, a preliminary first free layer pattern, and a sacrificial layer pattern, the sacrificial layer pattern and an upper portion of the preliminary first free layer pattern may be removed by a physical etching process and/or a wet etching process to form a first free layer pattern, and a second free layer and a tunnel barrier layer may be formed on the first free layer pattern. The second free layer may be partially oxidized to form a second free layer pattern that may be merged into the first free layer pattern, a fixed layer structure may be formed on the tunnel barrier layer, and an MTJ structure having no electrical short therein may be formed.

Example embodiments provide an MRAM device having good characteristics, and a method of manufacturing an MRAM device having good characteristics.

According to example embodiments, at least a portion of the free layer pattern may be formed not by a physical etching process, and the MTJ structure may be easily formed. The first free layer pattern may be formed by a physical etching process, and the second free layer pattern may be formed by partially oxidizing the second free layer on the first free layer pattern.

After forming the first and second free layer patterns, the tunnel barrier layer and the fixed layer structure or the fixed layer pattern structure may be sequentially formed thereon, and the physical etching process for forming the first MTJ structure may be minimized or reduced. The physical etching process may be performed, a height of layers that may be patterned simultaneously may be minimized or reduced, and magnetic material may be prevented from being attached onto a sidewall of the MTJ structure.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an MRAM device, the method comprising:
  forming a lower electrode and a preliminary first free layer pattern sequentially stacked on a substrate;

removing an upper portion of the preliminary first free layer pattern to form a first free layer pattern;

sequentially forming a second free layer and a tunnel barrier layer on the first free layer pattern in a first direction;

partially oxidizing the second free layer to form a second free layer pattern, the second free layer pattern including portions separated in a second direction by oxidized portions of the second free layer, the second direction being perpendicular to the first direction; and forming a fixed layer structure on the tunnel barrier layer.

2. The method as claimed in claim 1, wherein forming the lower electrode and the preliminary first free layer pattern includes:

sequentially forming a lower electrode layer, a first free layer, and a sacrificial layer on the substrate; and partially oxidizing the lower electrode layer and the first free layer.

3. The method as claimed in claim 2, wherein partially oxidizing the lower electrode layer and the first free layer includes:

forming a mask on the sacrificial layer, the mask partially exposing a top surface of the sacrificial layer; and performing an ion implantation process using the mask as an ion implantation mask to partially implant oxygen ions into the sacrificial layer, the first free layer, and the lower electrode layer.

4. The method as claimed in claim 3, wherein forming the second free layer pattern includes diffusing the oxygen ions implanted into the first free layer into the second free layer.

5. The method as claimed in claim 1, wherein forming the lower electrode and the preliminary first free layer pattern includes:

sequentially forming a lower electrode layer, a first free layer, a sacrificial layer, and a hard mask on the substrate;

anisotropically etching the sacrificial layer using the hard mask as an etching mask to form a sacrificial layer pattern; and sequentially patterning the first free layer and the lower electrode layer using the hard mask and the sacrificial layer pattern as an etching mask.

6. The method as claimed in claim 5, wherein forming the preliminary first free layer pattern includes forming a plurality of preliminary first free layer patterns, and after forming the lower electrode and the preliminary first free layer pattern, the method further comprises:

forming a capping layer on the substrate to cover the lower electrode, the preliminary first free layer pattern, the sacrificial layer pattern, and the hard mask;

forming an oxide layer on the capping layer to sufficiently cover the lower electrode, the preliminary first free layer pattern, the sacrificial layer pattern, and the hard mask; and planarizing the oxide layer and the capping layer until a top surface of the sacrificial layer pattern is exposed to form an oxide layer pattern and a capping layer pattern, respectively, the oxide layer pattern and the capping layer pattern being formed between neighboring two preliminary first free layer patterns, and the capping layer pattern surrounding the oxide layer pattern.

7. The method as claimed in claim 6, wherein forming the second free layer pattern includes diffusing oxygen ions included in the oxide layer pattern into the second free layer.

8. The method as claimed in claim 5, wherein forming the first free layer pattern includes performing an ion sputtering process to remove the sacrificial layer pattern and an upper portion of the preliminary first free layer pattern.

9. The method as claimed in claim 5, wherein forming the first free layer pattern includes:

performing a wet etching process using deionized water to remove the sacrificial layer pattern; and performing an ion sputtering process to remove the upper portion of the preliminary first free layer pattern.

10. The method as claimed in claim 1, wherein the second free layer is formed to have a thickness smaller than that of the first free layer pattern.

11. The method as claimed in claim 1, wherein the second free layer pattern is formed to include a material substantially the same as that of the first free layer pattern.

12. The method as claimed in claim 1, further comprising, after forming the fixed layer structure:

forming a wiring on the fixed layer structure.

13. A method of manufacturing an MRAM device, the method comprising:

forming a first free layer pattern on a lower electrode by a physical etching process, the lower electrode being on a substrate;

forming a second free layer on the first free layer pattern in a first direction; and forming a second free layer pattern by partially oxidizing the second free layer, the second free layer pattern including portions separated in a second direction by oxidized portions of the second free layer.

14. The method as claimed in claim 13, wherein:

partially oxidizing the second free layer includes diffusing oxygen ions into the second free layer to oxidize a portion of the second free layer and form the oxidized portions of the second free layer, which include an insulative first metal oxide layer pattern; and portions of the second free layer into which oxygen ions are not diffused form the second free layer pattern.

15. The method as claimed in claim 14, wherein:

diffusing oxygen ions into the second free layer includes performing a heat treatment process; and the first and second free layer patterns each includes at least one of cobalt, iron, and nickel.

16. The method as claimed in claim 15, wherein the physical etching process includes a reactive plasma etching process or an ion sputtering process.

17. The method as claimed in claim 16, wherein the physical etching process includes a reactive plasma etching process performed using an etching gas including at least one of hydrogen fluoride and ammonia ($NH_3$) and a reaction gas including oxygen.

* * * * *